US005543654A

United States Patent [19]
Dennen

[11] Patent Number: 5,543,654
[45] Date of Patent: *Aug. 6, 1996

[54] CONTOURED-TUB FERMI-THRESHOLD FIELD EFFECT TRANSISTOR AND METHOD OF FORMING SAME

[75] Inventor: Michael W. Dennen, Raleigh, N.C.

[73] Assignee: Thunderbird Technologies, Inc., Research Triangle Park, N.C.

[ * ] Notice: The term of this patent shall not extend beyond the expiration date of Pat. No. 5,374,836.

[21] Appl. No.: 351,643

[22] Filed: Dec. 7, 1994

Related U.S. Application Data

[63] Continuation-in-part of Ser. No. 37,636, Feb. 23, 1993, Pat. No. 5,374,836, which is a continuation-in-part of Ser. No. 977,689, Nov. 18, 1992, Pat. No. 5,369,295, which is a continuation of Ser. No. 826,939, Jan. 28, 1992, Pat. No. 5,194,923.

[51] Int. Cl.⁶ .................................................. H01L 29/76
[52] U.S. Cl. .......................... 257/386; 257/327; 257/403
[58] Field of Search .................................... 257/327, 336, 257/340, 344, 345, 386, 403, 404, 408, 391, 392

[56] References Cited

U.S. PATENT DOCUMENTS

| Re. 32,800 | 12/1988 | Han et al. ................... | 437/27 |
|---|---|---|---|
| 3,653,978 | 4/1972 | Robinson et al. ................ | 148/1.5 |
| 3,789,504 | 2/1974 | Jaddam ........................ | 29/571 |
| 3,872,491 | 3/1975 | Hanson et al. .................. | 357/23 |
| 4,042,945 | 8/1977 | Lin et al. ...................... | 357/23 |
| 4,092,548 | 5/1978 | Beilstein, Jr. et al. ............. | 257/403 |
| 4,108,686 | 8/1978 | Jacobus, Jr. .................... | 148/1.5 |
| 4,274,105 | 6/1981 | Crowder et al. ................. | 357/23 |
| 4,491,807 | 1/1985 | Hoover ....................... | 331/111 |
| 4,697,198 | 9/1987 | Komori et al. .................. | 357/23.3 |
| 4,701,775 | 10/1987 | Cosentino et al. ............... | 357/23.12 |
| 4,737,471 | 4/1988 | Shirato et al. .................. | 437/44 |

(List continued on next page.)

FOREIGN PATENT DOCUMENTS

| 0070744A3 | 1/1983 | European Pat. Off. . |
|---|---|---|
| 0073623A2 | 3/1983 | European Pat. Off. . |
| 0274278 | 7/1988 | European Pat. Off. . |
| 3138747A1 | 4/1983 | Germany . |
| 55-87481 | 7/1980 | Japan . |
| 55-87483 | 7/1980 | Japan . |
| 56-91473 | 7/1981 | Japan . |
| 57-10268 | 1/1982 | Japan . |
| 59-29460 | 2/1984 | Japan . |
| 61-53775 | 3/1986 | Japan . |
| 61-160975 | 7/1986 | Japan . |
| 62-248255 | 10/1987 | Japan . |
| 63-53975 | 3/1988 | Japan . |
| 1097139A | 4/1987 | Russian Federation . |

OTHER PUBLICATIONS

"Depleted Implant MOSFET", IBM Technical Disclosure, vol. 32, No. 10B, Mar. 1990, pp. 235–249.
G. Shahidi, *Fabrication of CMOS on Ultrathin SOI Obtained by Epitaxial Lateral Overgrowth and Chemical–Mechanical Polishing*, IEDM vol. 90, pp. 587–590, 1990.
A. Kamgar et al., *Utlra–High Speed CMOS Circuits in Thin SIMOX Films*, IEDM vol. 89, pp. 829–832, 1989.

(List continued on next page.)

*Primary Examiner*—Sara W. Crane
*Assistant Examiner*—Courtney A. Bowers
*Attorney, Agent, or Firm*—Bell, Selzter, Park & Gibson, P.A.

[57] ABSTRACT

A Fermi-threshold field effect transistor includes a contoured-tub region of the same conductivity type as the source, drain and channel regions and having nonuniform tub depth. The contoured-tub is preferably deeper under the source and/or drain regions than under the channel region. Thus, the tub-substrate junction is deeper under the source and/or drain regions than under the channel region. The diffusion capacitance is thereby reduced compared to a tub having a uniform tub depth, so that a high saturation current is produced at low voltages. The contoured-tub may be formed by an additional implant into the substrate using the gate as a mask.

23 Claims, 28 Drawing Sheets

U.S. PATENT DOCUMENTS

| | | | |
|---|---|---|---|
| 4,771,012 | 9/1988 | Yabu et al. | 437/29 |
| 4,819,043 | 4/1989 | Yazawa et al. | 357/23.3 |
| 4,831,422 | 6/1989 | Ohno | 357/233 |
| 4,841,346 | 6/1989 | Noguchi | 357/23.1 |
| 4,899,202 | 2/1990 | Blake et al. | 357/23.7 |
| 4,907,048 | 3/1990 | Huang | 357/23.9 |
| 4,928,156 | 5/1990 | Alvis et al. | 357/23.4 |
| 4,984,043 | 1/1991 | Vinal | 357/23.14 |
| 4,990,974 | 2/1991 | Vinal | 357/23.3 |
| 4,994,872 | 2/1991 | Nishizawa et al. | 357/23.4 |
| 5,119,152 | 6/1992 | Mizuno | 357/23.3 |
| 5,151,759 | 9/1992 | Vinal | 357/23.3 |
| 5,192,990 | 3/1993 | Stevens | 257/229 |
| 5,194,923 | 3/1993 | Vinal | 257/268 |
| 5,369,295 | 11/1994 | Vinal | 257/288 |
| 5,371,396 | 11/1994 | Vinal et al. | 257/412 |
| 5,374,836 | 12/1994 | Vinal et al. | 257/344 |
| 5,440,160 | 8/1995 | Vinal | 257/327 |

OTHER PUBLICATIONS

S. Odanaka, et al., *A New Half–Micrometer P–Channel MOSFET with Efficient Punchthrough Stops,* IEEE Transactions on Electron Devices, vol. ED–33, No. 3, Mar., 1986, pp. 317–321.

S. J. Hillenius, et al., *Gate Material Work Function Considerations for 0.5 Micron CMOS,* IEEE, pp. 147–150, 1985.

Adele E. Schmitz, et al., *High Performance Subhalf–Micrometer P–Channel Transistors for CMOS VLSI,* IEDM 84, pp. 423–426.

S. Chiang, et al., *Optimization of Sub–Micron P–Channel FET Structure,* IEEE, pp. 534–535, 1983.

E. Takeda, et al., *Submicron MOSFET Structure for Minimizing Channel Hot–Electron Injection,* 1981 Symposium on VLSI Technology, Hawaii (Sep./1981). Dig. Tech. Papers pp. 22–23.

E. Sun, et al., *The Junction MOS (JMOS) Transistor—A High Speed Transistor for VLSI,* IEEE, pp. 791–794, 1980.

K. Nishiuchi, et al., *A Normally–Off Type Buried Channel MOSFET for VLSI Circuits,* IEDM Technical Digest, 1979, pp. 26–29.

M. Hswe, et al., *Characteristics of P–Channel MOS Field Effect Transistors with Ion–Implanted Channels,* Solid–State Electronics, vol. 15, pp. 1237–1243, 1972.

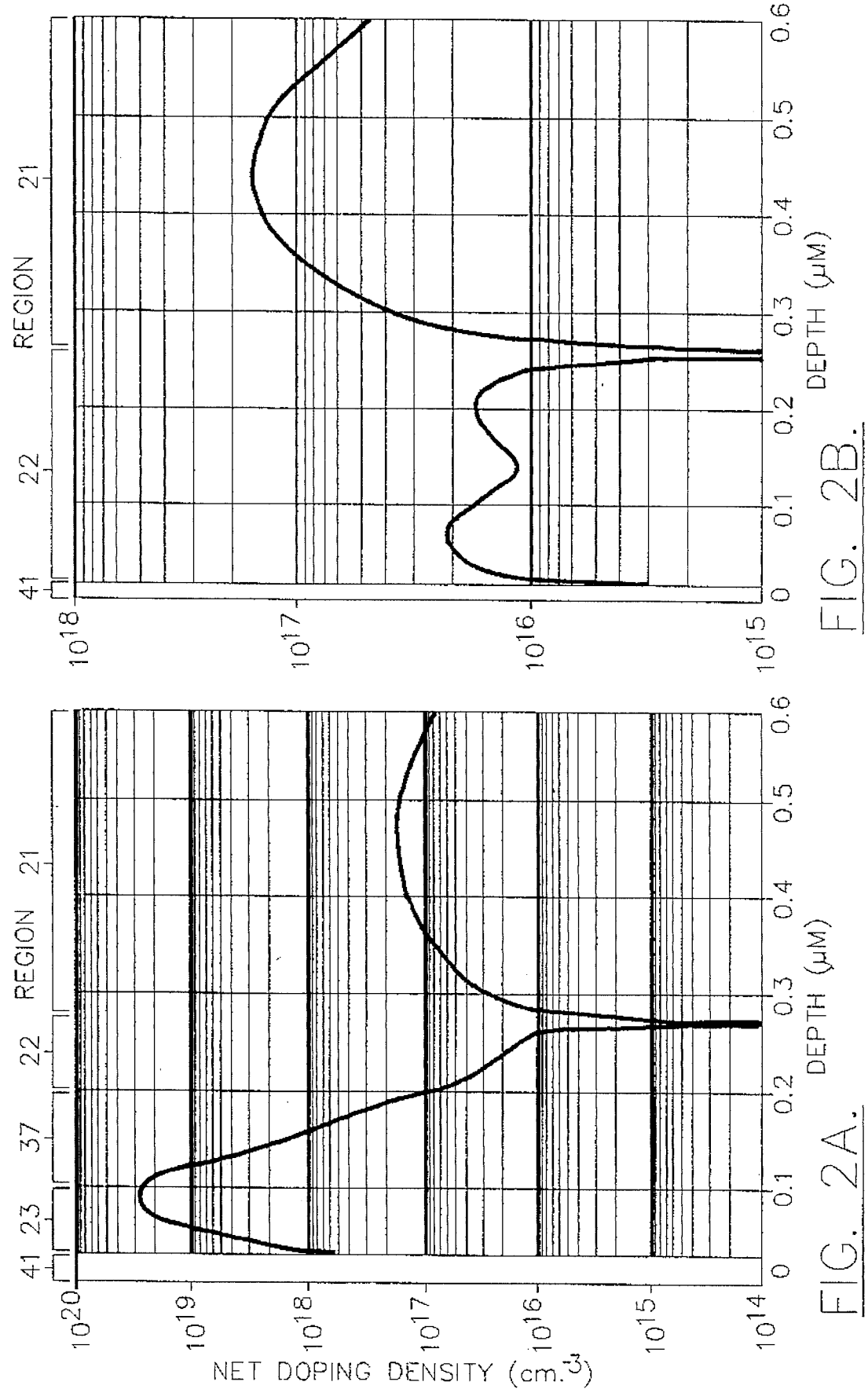

CONTOURED-TUB FERMI-THRESHOLD FIELD EFFECT TRANSISTOR AND METHOD OF FORMING SAME

CROSS-REFERENCE TO RELATED APPLICATIONS

This application is a continuation-in-part of application Ser. No. 08/037,636, filed Feb. 23, 1993, now U.S. Pat. No. 5,374,836, which is itself a continuation-in-part of application Ser. No. 07/977,689, filed Nov. 18, 1992, now U.S. Pat. No. 5,369,295, which is itself a continuation of application Ser. No. 07/826,939, filed Jan. 28, 1992, now U.S. Pat. No. 5,194,923. The disclosures of all of these prior applications are hereby incorporated herein by reference.

FIELD OF THE INVENTION

This invention relates to field effect transistor devices and more particularly to integrated circuit field effect transistors which are capable of producing high currents.

BACKGROUND OF THE INVENTION

Field effect transistors (FET) have become the dominant active device for very large scale integration (VLSI) and ultra large scale integration (ULSI) applications, such as logic devices, memory devices and microprocessors, because the integrated circuit FET is by nature a high impedance, high density, low power device. Much research and development activity has focused on improving the speed and integration density of FETs, and on lowering the power consumption thereof.

A high speed, high performance field effect transistor is described in U.S. Pat. Nos. 4,984,043 and 4,990,974, both by coinventor Albert W. Vinal, both entitled *Fermi Threshold Field Effect Transistor* and both assigned to the assignee of the present invention. These patents describe a metal oxide semiconductor field effect transistor (MOSFET) which operates in the enhancement mode without requiring inversion, by setting the device's threshold voltage to twice the Fermi potential of the semiconductor material. As is well known to those having skill in the art, Fermi potential is defined as that potential for which an energy state in a semiconductor material has a probability of one-half of being occupied by an electron. As described in the above mentioned Vinal patents, when the threshold voltage is set to twice the Fermi potential, the dependence of the threshold voltage on oxide thickness, channel length, drain voltage and substrate doping is substantially eliminated. Moreover, when the threshold voltage is set to twice the Fermi potential, the vertical electric field at the substrate face between the oxide and channel is minimized, and is in fact substantially zero. Carrier mobility in the channel is thereby maximized, leading to a high speed device with greatly reduced hot electron effects. Device performance is substantially independent of device dimensions.

Notwithstanding the vast improvement of the Fermi-threshold FET compared to known FET devices, there was a need to lower the capacitance of the Fermi-FET device. Accordingly, in U.S. patent application Ser. Nos. 07/826,939 and 07/977,689, both by coinventor Albert W. Vinal, and both entitled *Fermi Threshold Field Effect Transistor With Reduced Gate and Diffusion Capacitance,* a Fermi-FET device is described which allows conduction carriers to flow within the channel at a predetermined depth in the substrate below the gate, without requiring an inversion layer to be created at the surface of the semiconductor in order to support carrier conduction. Accordingly, the average depth of the channel charge requires inclusion of the permittivity of the substrate as part of the gate capacitance. Gate capacitance is thereby substantially reduced.

As described in the aforesaid patent applications, the low capacitance Fermi-FET is preferably implemented using a Fermi-tub region having a predetermined depth and a conductivity type opposite the substrate conductivity type and the same conductivity type as the drain and source. The Fermi-tub extends downward from the substrate surface by a predetermined depth, and the drain and source diffusions are formed in the Fermi-tub within the tub boundaries. The Fermi-tub forms a unijunction transistor, in which the source, drain, channel and Fermi-tub are all doped the same conductivity type, but at different doping concentrations. A low capacitance Fermi-FET is thereby provided. The low capacitance Fermi-FET including the Fermi-tub will be referred to herein as a "low capacitance Fermi-FET" or a "Tub-FET".

Notwithstanding the vast improvement of the Fermi-FET and the low capacitance Fermi-FET compared to known FET devices, there is a continuing need to improve operation of the Fermi-FET at low voltages. As is well known to those having skill in the art, there is currently much emphasis on low power portable and/or battery-powered devices which typically operate at power supply voltages of five volts, three volts, one volt or less.

Unfortunately, as operating voltages decrease, FET devices typically must also decrease the channel length in order to improve the ratio of drain voltage to saturation current which dictates the circuit speed. However, it is difficult to decrease the channel length of FET devices while still maintaining acceptable manufacturing yields.

In particular, for a given channel length, lowering of the operating voltage causes the lateral electric field to drop linearly. At very low operating voltages, the lateral electric field is so low that the carriers in the channel are prevented from reaching saturation velocity. This results in a precipitous drop in the available drain current. The drop in drain current effectively limits the decrease in operating voltage for obtaining usable circuit speeds for a given channel length.

SUMMARY OF THE INVENTION

It is therefore an object of the invention to provide an improved Fermi-threshold Field Effect Transistor (Fermi-FET) and method of forming same.

It is another object of the invention to provide a Fermi-FET which is capable of producing high current at relatively low operating voltages and method of forming same.

These and other objects are provided, according to the present invention, by a Fermi-FET which includes a contoured Fermi-tub region having nonuniform tub depth. In particular, the Fermi-tub is deeper under the source and/or drain regions than under the channel region. Thus, the tub-substrate junction is deeper under the source and/or drain regions than under the channel region. Diffusion capacitance is thereby reduced compared to a Fermi-tub having a uniform tub depth, so that high saturation current is produced at low voltages. It will be understood by those having skill in the art that the contoured-tub Fermi-FET may also be used for higher voltage applications, for example, at operating voltages of more than five volts.

In particular, a contoured-tub Fermi-threshold field effect transistor according to the invention includes a semiconductor substrate of first conductivity type and spaced-apart source and drain regions of second conductivity type in the semiconductor substrate at a face thereof. A channel region of the second conductivity type is also formed in the semiconductor substrate at the substrate face between the spaced-apart source and drain regions. A tub region of the second conductivity type is also included in the semiconductor substrate at the substrate face. The tub region extends a first predetermined depth from the substrate face to below at least one of the spaced-apart source and drain regions, and extends a second predetermined depth from the substrate face to below the channel region. The second predetermined depth is less than the first predetermined depth. A gate insulating layer and source, drain and gate contacts are also included. A substrate contact may also be included.

Preferably, the second predetermined depth, i.e. the depth of the contoured-tub adjacent the channel, is selected to satisfy the Fermi-FET criteria as defined in the aforementioned application Ser. Nos. 08/826,939 and 07/977,689. In particular, the second predetermined depth is selected to produce zero static electric field perpendicular to the substrate face at the bottom of the channel. The second predetermined may also be selected to produce a threshold voltage for the field effect transistor which is twice the Fermi potential of the semiconductor substrate. The first predetermined depth, i.e. the depth of the contoured-tub region adjacent the source and/or drain is preferably selected to deplete the tub region under the source and/or drain regions upon application of zero bias to the source and/or drain contact.

The contoured-tub of the present invention may be formed by an additional ion implantation step compared to a Fermi-FET having uniform tub depth. A tub of first conductivity type is first formed in a semiconductor substrate of second conductivity type, extending from a face of the substrate to a predetermined depth from the substrate face. A standard field oxide region may be used as a mask in forming the tub. A gate is then formed on a portion of the tub at the substrate face. First ions of first conductivity type are implanted into the substrate face at a depth which is greater than the predetermined depth, with the gate masking implantation of the first ions into the substrate under the gate. The tub and the first ions thereby form a contoured-tub having nonuniform tub depth. Second ions of the first conductivity type are implanted into the substrate face, with the gate masking implantation of the second ions into the substrate under the gate, to form source and drain regions. It will be understood that the step of implanting second ions to form the source and drain may be performed prior to the step of implanting first ions to form the contoured-tub. Preferably, the step of implanting first ions and the step of implanting second ions both use the same ionic species at different doses and energies. However, different ionic species may be used.

Accordingly, the junction between the substrate and the Fermi-tub is moved away from the source and/or drain regions. This reduces the diffusion capacitance and thereby increases the speed of the contoured-tub Fermi-FET at low voltages. The Fermi-tub may be contoured under either or both of the source and drain regions. The contoured-tub may also be used with the gate sidewall spacers and substrate contact of application Ser. No. 08/0837,636. A Fermi-FET which is particularly suitable for low voltage operation is thereby provided.

BRIEF DESCRIPTION OF THE DRAWINGS

FIGS. 2A–2C graphically illustrate preferred doping profiles and geometries for the high current Fermi-FET of FIG. 1 having a 0.8 μm channel.

DETAILED DESCRIPTION OF PREFERRED EMBODIMENTS

Figure 1:
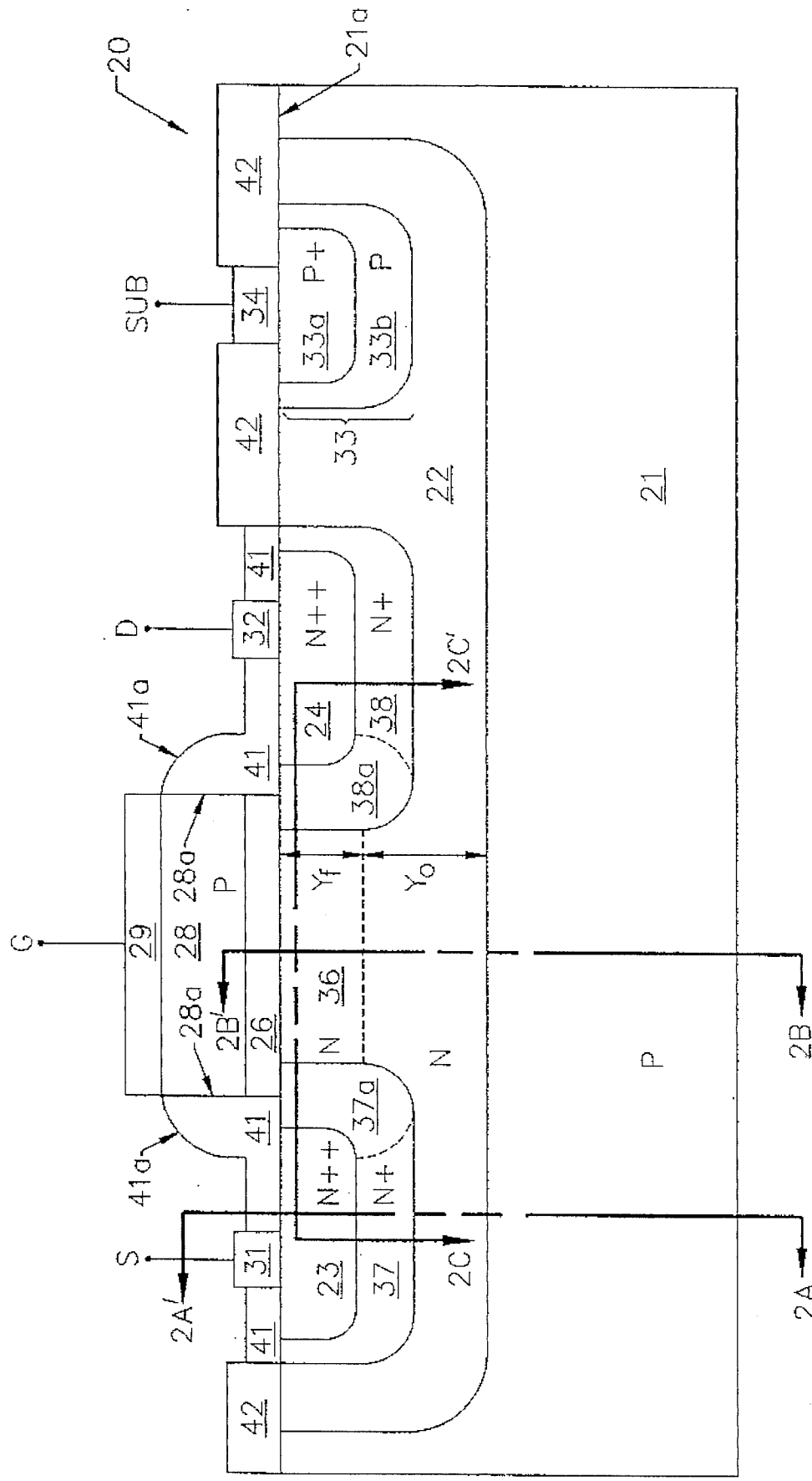
FIG. 1 illustrates a cross-sectional view of an N-channel high current Fermi-FET according to application Ser. No. 08/037,636.

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout.

Before describing the contoured-tub Fermi-threshold field effect transistor of the present invention, the Fermi-threshold field effect transistor with reduced gate and diffusion capacitance of application Ser. Nos. 07/826,939 and 07/977,689 (also referenced as the "low capacitance Fermi-FET" or the "Tub-FET" will be described as will the high current Fermi-Threshold field effect transistor of application Ser. No. 08/037,636. A more complete description may be found in these applications, the disclosures of which are hereby incorporated herein by reference. After describing the low capacitance Fermi-FET, the high current Fermi-FET of the present invention will be described as will the low leakage current short channel Fermi-FET.

Fermi-FET With Reduced Gate and Diffusion Capacitance

The following summarizes the low capacitance Fermi-FET including the Fermi-tub. Additional details may be found in application Ser. Nos. 07/826,939 and 07/977,689.

Conventional MOSFET devices require an inversion layer to be created at the surface of the semiconductor in order to support carrier conduction. The depth of the inversion layer is typically 100 Å or less. Under these circumstances gate capacitance is essentially the permittivity of the gate insulator layer divided by its thickness. In other words, the channel charge is so close to the surface that effects of the dielectric properties of the substrate are insignificant in determining gate capacitance.

Gate capacitance can be lowered if conduction carriers are confined within a channel region below the gate, where the average depth of the channel charge requires inclusion of the permittivity of the substrate to calculate gate capacitance. In general, the gate capacitance of the low capacitance Fermi-FET is described by the following equation:

$$C_g = \frac{1}{\frac{Y_f}{\beta e_s} + \frac{T_{ox}}{e_i}} \quad (1)$$

Where $Y_f$ is the depth of the conduction channel called the Fermi channel, $e_s$ is the permittivity of the substrate, and $\beta$ is the factor that determines the average depth of the charge flowing within the Fermi channel below the surface. $\beta$ depends on the depth dependant profile of carriers injected from the source into the channel. For the low capacitance Fermi-FET, $\beta \approx 2$. $T_{ox}$ is the thickness of the gate oxide layer and $e_i$ is its permittivity.

The low capacitance Fermi-FET includes a Fermi-tub region of predetermined depth, having conductivity type opposite the substrate conductivity type and the same conductivity type as the drain and source regions. The Fermi-tub extends downward from the substrate surface by a predetermined depth, and the drain and source diffusions are formed in the Fermi-tub region within the Fermi-tub boundaries. The preferred Fermi-tub depth is the sum of the Fermi channel depth $Y_f$ and depletion depth $Y_o$. A Fermi channel region with predetermined depth $Y_f$ and width Z, extends between the source and drain diffusions. The conductivity of the Fermi channel is controlled by the voltage applied to the gate electrode.

The gate capacitance is primarily determined by the depth of the Fermi channel and the carrier distribution in the Fermi channel, and is relatively independent of the thickness of the gate oxide layer. The diffusion capacitance is inversely dependant on the difference between [the sum of the depth of the Fermi-tub and the depletion depth $Y_o$ in the substrate] and the depth of the diffusions $X_d$. The diffusion depth is preferably less than the depth of the Fermi-tub, $Y_{Tub}$. The dopant concentration for the Fermi-tub region is preferably chosen to allow the depth of the Fermi channel to be greater than three times the depth of an inversion layer within a MOSFET.

Accordingly, the low capacitance Fermi-FET includes a semiconductor substrate of first conductivity type having a first surface, a Fermi-tub region of second conductivity type in the substrate at the first surface, spaced apart source and drain regions of the second conductivity type in the Fermi-tub region at the first surface, and a channel of the second conductivity type in the Fermi-tub region at the first surface between the spaced apart source and drain regions. The channel extends a first predetermined depth ($Y_f$) from the first surface and the tub extends a second predetermined depth ($Y_o$) from the channel. A gate insulating layer is provided on the substrate at the first surface between the spaced apart source and drain regions. Source, drain and gate electrodes are provided for electrically contacting the source and drain regions and the gate insulating layer respectively.

At least the first and second predetermined depths are selected to produce zero static electric field perpendicular to the first surface at the first depth, upon application of the threshold voltage of the field effect transistor to the gate electrode. The first and second predetermined depths are also selected to allow carriers of the second conductivity type to flow from the source to the drain in the channel, extending from the first predetermined depth toward the first surface upon application of the voltage to the gate electrode beyond the threshold voltage of the field effect transistor. The carriers flow from the source to the drain region beneath the first surface without creating an inversion layer in the Fermi-tub region. The first and second predetermined depths are also selected to produce a voltage at the substrate surface, adjacent the gate insulating layer, which is equal and opposite to the sum of the voltages between the substrate contact and the substrate and between the polysilicon gate electrode and the gate electrode.

When the substrate is doped at a doping density $N_s$, has an intrinsic carrier concentration $N_i$ at temperature T degrees Kelvin and a permittivity $e_s$, and the field effect transistor includes a substrate contact for electrically contacting the substrate, and the channel extends a first predetermined depth $Y_f$ from the surface of the substrate and the Fermi-tub region extends a second predetermined depth $Y_o$ from the channel, and the Fermi-tub region is doped at a doping density which is a factor $\alpha$ times $N_s$, and the gate electrode includes a polysilicon layer of the first conductivity type and which is doped at a doping density $N_p$, the first predetermined depth ($Y_f$) is equal to:

$$Y_f = \sqrt{\frac{2e_s}{qN_s\alpha} \cdot \frac{KT}{q} \ln\left(\frac{N_p}{N_s}\right)}, \quad (2)$$

where q is $1.6 \times 10^{-19}$ coulombs and K is $1.38 \times 10^{-23}$ Joules/°Kelvin. The second predetermined depth ($Y_o$) is equal to:

$$Y_o = \sqrt{\frac{2e_s\phi_s}{qN_s\alpha(\alpha+1)}}, \quad (3)$$

where $\phi_s$ is equal to $2\phi_f + KT/q \ln\alpha$, and $\phi_f$ is the Fermi potential of the semiconductor substrate.

High Current Fermi-FET Structure

Referring now to FIG. 1, an N-channel high current Fermi-FET according to application Ser. No. 08/037,636 is illustrated. It will be understood by those having skill in the art that a P-channel Fermi-FET may be obtained by reversing the conductivities of the N and P regions.

As illustrated in FIG. 1, high current Fermi-FET 20 is fabricated in a semiconductor substrate 21 having first conductivity type, here P-type, and including a substrate surface 21a. A Fermi-tub region 22 of second conductivity type, here N-type, is formed in the substrate 21 at the surface 21a. Spaced apart source and drain regions 23 and 24, respectively, of the second conductivity type, here N-type, are formed in the Fermi-tub region 22 at the surface 21a. It will be understood by those having skill in the art that the source and drain regions may also be formed in a trench in the surface 21a.

A gate insulating layer 26 is formed on the substrate 21 at the surface 21a between the spaced apart source and drain regions 23 and 24, respectively. As is well known to those having skill in the art, the gate insulating layer is typically silicon dioxide. However, silicon nitride and other insulators may be used.

A gate electrode is formed on gate insulating layer 26, opposite the substrate 21. The gate electrode preferably includes a polycrystalline silicon (polysilicon) gate electrode layer 28 of first conductivity type, here P-type. A conductor gate electrode layer, typically a metal gate electrode layer 29, is formed on polysilicon gate electrode 28 opposite gate insulating layer 26. Source electrode 31 and drain electrode 32, typically metal, are also formed on source region 23 and drain region 24, respectively.

A substrate contact 33 of first conductivity type, here P-type, is also formed in substrate 21, either inside Fermi-tub 22 as shown or outside tub 22. As shown, substrate contact 33 is doped first conductivity type, here P-type, and may include a relatively heavily doped region 33a and a relatively lightly doped region 33b. A substrate electrode 34 establishes electrical contact to the substrate.

The structure heretofore described with respect to FIG. 1 corresponds to the low capacitance Fermi-FET structure of application Ser. Nos. 07/977,689 and 07/826,939. As already described in these applications, a channel 36 is created between the source and drain regions 23 and 24. The depth of the channel from the surface 21a, designated at $Y_f$ in FIG. 1, and the depth from the bottom of the channel to the bottom of the Fermi-tub 22, designated as $Y_0$ in FIG. 1, along with the doping levels of the substrate 21, tub region 22, and polysilicon gate electrode 28 are selected to provide a high performance, low capacitance field effect transistor using the relationships of Equations (2) and (3) above.

Still referring to FIG. 1, a source injector region 37a of second conductivity type, here N-type, is provided adjacent the source region 23 and facing the drain region. As will be described below, the source injector region provides a high current, Fermi-FET by controlling the depth at which carriers are injected into channel 36. The source injector region 37a may only extend between the source region 23 and the drain region 24. The source injector region preferably surrounds source region 23 to form a source injector tub region 37, as illustrated in FIG. 1. Source region 23 may be fully surrounded by the source injector tub region 37, on the side and bottom surface. Alternatively, source region 23 may be surrounded by the source injector tub region 37 on the side, but may protrude through the source injector tub region 37 at the bottom. Still alternatively, source injector region 37a may extend into substrate 21, to the junction between Fermi-tub 22 and substrate 21. A drain injector region 38a, preferably a drain injector tub region 38 surrounding drain region 24, is also preferably provided.

Source injector region 37a and drain injector region 38a or source injector tub region 37 and drain injector tub region 38, are preferably doped the second conductivity type, here N-type, at a doping level which is intermediate the relatively low doping level of Fermi-tub 22 and the relatively high doping level of source 23 and drain 24. Accordingly, as illustrated in FIG. 1, Fermi-tub 22 is designated as being N, source and drain injector tub regions 37, 38 are designated as N+ and source and drain regions 23, 24 are designated as N++. A unijunction transistor is thereby formed.

The high current Fermi-FET provides drive currents that are about four times that of state of the art FETs. Gate capacitance is about half that of a conventional FET device. The doping concentration of the source injector tub region 37 controls the depth of carriers injected into the channel region 36, typically to about 1000 Å. The source injector tub region 37 doping concentration is typically 2E18, and preferably has a depth at least as great as the desired maximum depth of injected majority carriers. Alternatively, it may extend as deep as the Fermi-tub region 22 to minimize subthreshold leakage current, as will be described below. It will be shown that the carrier concentration injected into the channel 36 cannot exceed the doping concentration of the source injector region 37a facing the drain. The width of the portion of source injector region 37a facing the drain is typically in the range of 0.05–0.15 μm. The doping concentration of the source and drain regions 23 and 24 respectively, is typically 1E19 or greater. The depth ($Y_f + Y_0$) of the Fermi-tub 22 is approximately 2200 Å with a doping concentration of approximately 1.8E16.

As illustrated in FIG. 1, the high current Fermi-FET 20 also includes a gate sidewall spacer 41 on the substrate surface 21a, which extends from adjacent the source injector region 37a to adjacent the polysilicon gate electrode 28. Gate sidewall spacer 41 also preferably extends from adjacent the drain injector region 38a to adjacent the polysilicon gate electrode 28. In particular, as shown in FIG. 1, gate sidewall spacer 41 extends from the polysilicon gate electrode sidewall 28a and overlies the source and drain injector regions 37a and 38a respectively. Preferably the gate sidewall spacer 41 surrounds the polysilicon gate electrode 28. Also preferably, and as will be discussed in detail below, the gate insulating layer 26 extends onto the source injector region 37a and the drain injector region 38a at the substrate face 21a and the gate sidewall spacer 41 also extends onto the source injector region 37 and drain injector region 38.

The gate sidewall spacer 41 lowers the pinch-off voltage of the Fermi-FET 20 and increases its saturation current in a manner in which will be described in detail below. Preferably, the gate sidewall spacer is an insulator having a permittivity which is greater than the permittivity of the gate insulating layer 26. Thus, for example, if the gate insulating layer 26 is silicon dioxide, the gate sidewall spacer is preferably silicon nitride. If the gate insulating layer 26 is silicon nitride, the gate sidewall spacer is preferably an insulator which has permittivity greater than silicon nitride.

As shown in FIG. 1, the gate sidewall spacer 41 may also extend onto source and drain regions 23 and 24 respectively, and the source and drain electrodes 31 and 32 respectively may be formed in the extension of the gate sidewall spacer region. Conventional field oxide or other insulator 42 regions separate the source, drain and substrate contacts. It will also be understood by those having skill in the art that although the outer surface 41a of gate sidewall spacer 41 is illustrated as being curved in cross section, other shapes may be used, such as a linear outer surface to produce a triangular cross section or orthogonal outer surfaces to produce a rectangular cross section.

Design of 0.8 μm High Current Fermi-FET

Figure 2C:
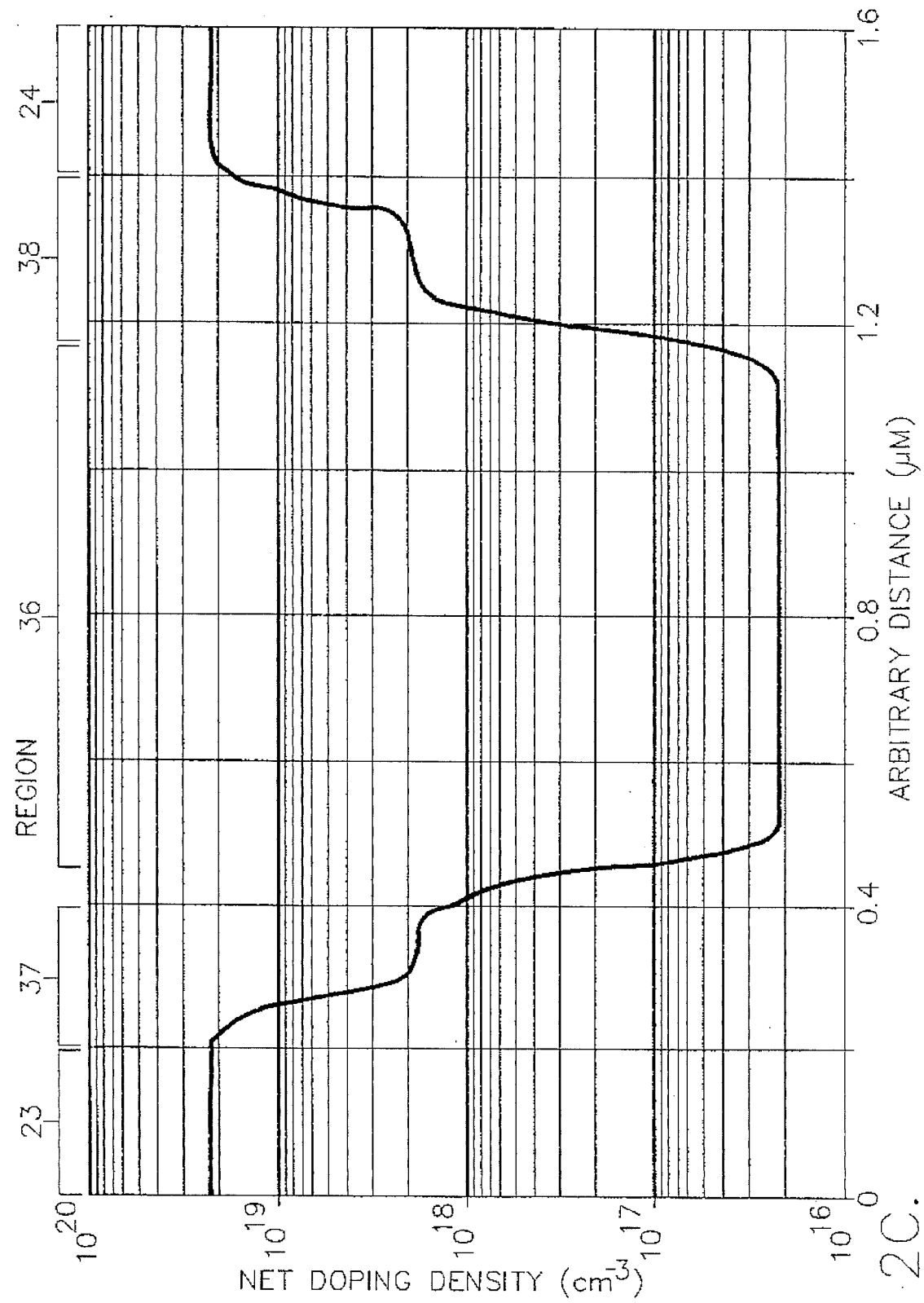

Referring now to FIGS. 2A–2C, preferred doping profiles and geometries for designing a 0.8 μm channel high current Fermi-FET as illustrated in FIG. 1 will now be described. It will be understood by those having skill in the art that both N and P channel FETs are fabricated in a similar fashion. FIGS. 2A–2C are simulation results which graphically illustrate N-channel high current Fermi-FET doping profiles to produce a 0.8 μm channel length device leading to the drain current properties illustrated in FIGS. 5B and 5C. It is well known to those having skill in the art how to achieve these doping profiles, using many well known techniques.

In the examples of FIGS. 2A–2C, the P-type doping concentration of the polysilicon gate electrode 28 is 2E19 for either P- or N-channel FETs. The SiO$_2$ gate insulating layer 26 is 140 Å thick. The thickness of the polysilicon gate electrode 28 is 3000 Å. The height of the gate sidewall spacer 41 is also 3000 Å, and the gate sidewall spacer 41 is fabricated of silicon nitride. The width of the source injector tub region portion 37a facing the drain is about 0.1 μm and the gate insulating layer 26 overlaps this region by about 0.05 μm.

Referring now to FIG. 2A, a vertical doping profile along the line 2A–2A' of FIG. 1, perpendicular to the face 21a and centered about the source 23 is described. The region to which the profile applies is also labeled at the top of the horizontal axis of FIG. 2A. As shown, the gate sidewall spacer region 41 has a thickness of about 140 Å and the source region 23 has a depth of about 2000 Å from the face 21a. Source injector tub region 37 has a depth of about 2000 Å from face 21a and Fermi-tub 22 has a depth ($Y_f+Y_0$) of 2200 Å from the face 21a. The thickness of substrate 21 is about 1 μm. The source injector tub 37 doping concentration is about 2E18 and the source region 23 doping is about 2.5E19.

FIG. 2B is a doping profile taken along line 2B–2B' in FIG. 1. As shown in FIG. 2B, the Fermi-tub 22 has been implanted using a double implantation process which produces a double hump. However, it will be understood by those having skill in the art that multiple implants or other techniques may be used to produce a more uniform doping profile for the Fermi-tub if desired. The Fermi-tub 22 depth is shown to be about 2200 Å with an average concentration in the flat region of 1.8E16. The effective humpback substrate doping concentration is about 1E17.

FIG. 2C illustrates a doping profile along lines 2C–2C' of FIG. 1. In other words, it is a doping profile from the middle of source region 23 through source injector region 37a through channel 36 and through drain injector region 38a and to the middle of drain 24. These regions are denoted in the FIG. 2C as well.

Operation of the Injector and Gate Sidewall Spacer Regions

Figure 3:
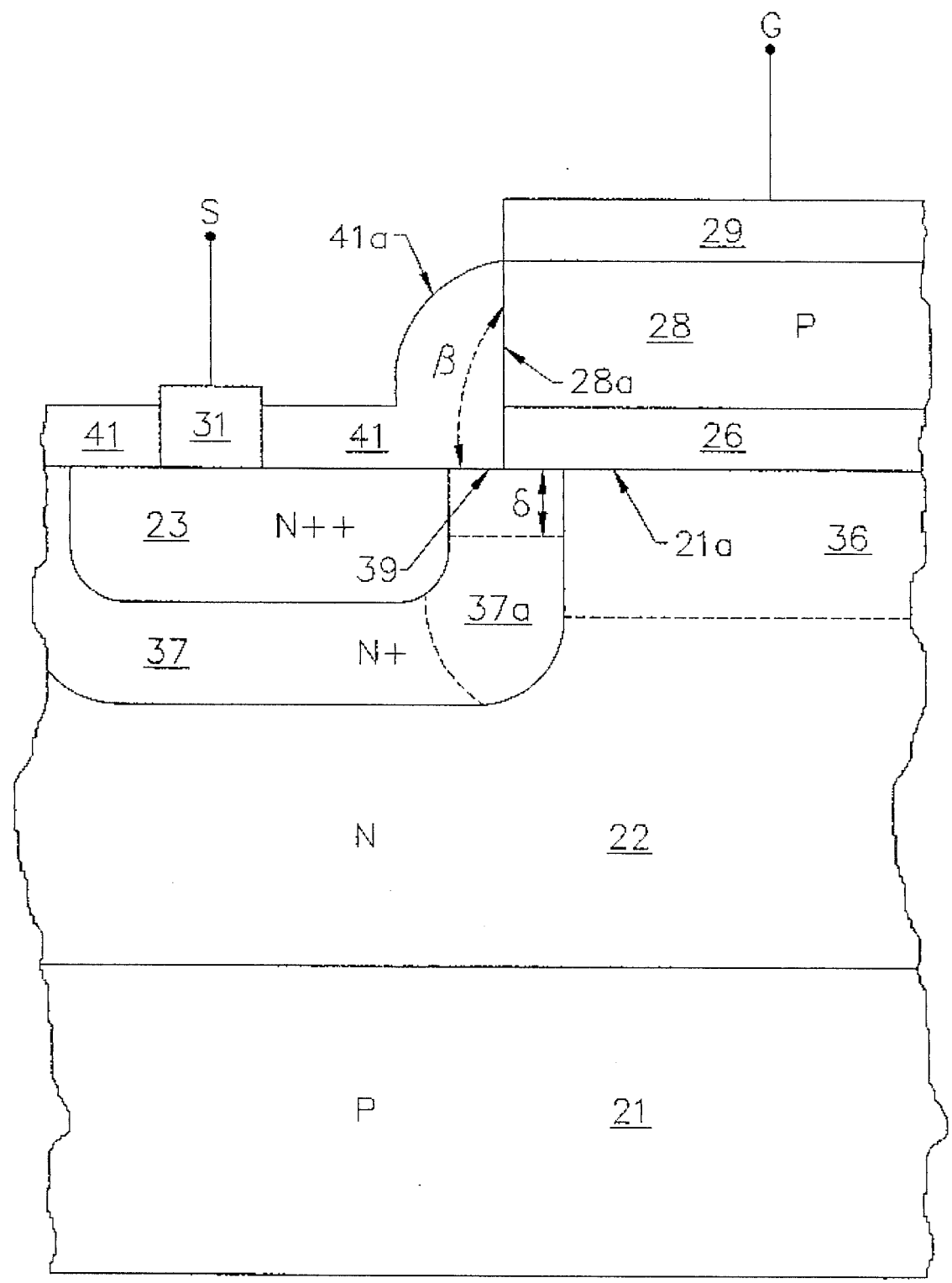
FIG. 3 illustrates an enlarged cross-sectional view of a portion of the high current Fermi-FET of FIG. 1.

Referring now to FIG. 3, an enlarged cross section of the area between source 23 and polysilicon gate electrode 28 is illustrated, in order to explain the operation of source injector region 37a and gate sidewall spacer region 41. When gate voltage exceeds source voltage, an electric field $E_{ii}$ terminates at interface 39 between the injector region 37a and the spacer 41. This field $E_{ii}$ is produced by the potential difference between the polysilicon gate electrode 28 and the surface of the injector region 37a at interface 39. This electric field creates charge accumulation within depth δ at the surface of the injector 37a, as illustrated in FIG. 3. From boundary conditions at the injector-insulator interface 39 and use of the divergence theorem, the following conditions prevail:

$$e_s E_s = e_{ii} E_{iin} \tag{4}$$

where $e_s$ is the permittivity of the substrate 21, $E_s$ is the electric field in injector 37a at interface 39, $e_{ii}$ is the permittivity of the spacer region 41 and $E_{iin}$ is the electric field in spacer region 41 at the interface 39.

Therefore, the electric field at the surface of the silicon $E_s$ is expressed in terms of the different permittivities at the interface and the electric field in the injector insulator, $E_{iin}$:

$$E_s = \frac{e_{ii}}{e_s} E_{iin} \tag{5}$$

When the source 23 is at ground potential and the polysilicon gate electrode 28 is at gate voltage $V_g$ above ground (N-channel), the injector insulator field $E_{iin}$ is expressed as the difference between gate and injector surface potential $\phi_s$ divided by the effective spacer region insulator thickness $\beta T_{in}$, where $V_t$ is the threshold voltage:

$$E_{iin} = \frac{(V_g - V_t) - \phi_s}{\beta T_{iin}} \tag{6}$$

Fringe field factor β is generally greater than one and is due to the length of the fringe field path from the sidewall 28a of the polysilicon gate electrode 28 and the interface 39, as illustrated in FIG. 3. For long channel devices β approaches 1.0. For short channel devices β>1.0. The difference is due to the depth of the charge accumulation layer in the polysilicon gate electrode layer 28 above the insulator interface. For short channel devices this depth increases tending to increase fringe factor β.

The gate sidewall spacer 41 may be the same material as the gate insulating layer 26. However in general the permittivity $e_{ii}$ of the sidewall spacer 41 should be higher than the permittivity $e_{gi}$ of the gate insulating layer 26. Preferably the ratio $e_{ii}/e_{gi}$ should be at least equal to fringe factor β. If β=1, the increased permittivity acts to lower subthreshold leakage current. A good choice of materials is silicon dioxide (SiO$_2$) for the gate insulator 26 and silicon nitride (Si$_3$N$_4$) for the gate sidewall spacer 41.

Based on Equations (5) and (6) the surface electric field $E_s$ is:

$$E_s = \frac{e_{ii}}{e_s}\left(\frac{(V_g - V_t) - \phi_s}{\beta T_{in}}\right) = \frac{q}{e_s}\int_0^\delta N_{ac}(y)dy \quad (7)$$

where $\delta$ is the depth of the accumulation region, q is the electron charge, and $N_{ac}(y)$ is the depth dependent concentration of the accumulation charge at the surface of the injector.

Since Fermi-FET conduction depends on accumulation rather than inversion, a similar expression can be written for the equivalent total accumulation of majority carriers under the gate electrode with low drain voltage. The actual flow depth $\delta$ of this charge is controlled by the injection profile. The expression is:

$$E_{si} = \frac{e_{ii}}{e_s}\left(\frac{(V_g - V_t) - \phi_s}{T_{gin}}\right) = \frac{q}{e_s}\int_0^\delta N_{gac}(y)dy \quad (8)$$

A fundamental relationship between surface potential $\phi_s$ and surface field $E_s$ will now be derived. The total charge in the channel region 36 when drain voltage is close to zero, is:

$$Q = ZL_o q \int_0^\delta N_{ch}(y)dy \quad (9)$$

Where $N_{ch}(y)$ is the volume density of channel charge measured in the vertical direction, and $\delta$ is the depth of flow charge at the source end of the channel. Using the divergence theorem, the vertical electrical field intensity $E_s$ in silicon at the insulator-silicon interface 39 at the source end of the channel is:

$$E_s = \frac{q}{e_s}\int_0^\delta N_{ch}(y)dy \quad (10)$$

Comparing Equations (9) and (10), surface field $E_s$ is independent of charge distribution within the depth direction of the channel and only depends on total charge per unit gate area Q*. Thus:

$$E_s = \frac{Q}{ZL_o e_s} = \frac{Q^*}{e_s} \quad (11)$$

The surface potential at the source end of the channel due to this same channel charge distribution is now determined. Using Poisson's equation, surface potential $\phi_s$ under the injector insulator at the source end of the channel is:

It will be shown subsequently that gate induced injection of excess charge into a Fermi channel $$\phi_s = \frac{q}{e_s}\int_0^\delta\int_0^y N_{ch}(y)dydy \quad (12)$$

region at the source—channel interface is quite uniform in flow depth depending on the character of the source injector region 37a. Under these circumstances it is reasonable to assume $N_{ch}(y) = N_{do}$ within flow depth $\delta$. For this condition Equation (12) reduces to:

$$\phi_s = \frac{\delta(q\delta N_{do})}{2e_s} \quad (13)$$

Therefore, from Equation (9), the condition, $N_{ch}(y) = N_{do}$, leads to the following fundamental relationship between surface potential $\phi_s$ and surface field $E_s$:

$$\phi_s = \frac{\delta}{2} E_s \quad (14)$$

Stated in words, surface potential near the source end of the channel is the product of half the flow channel depth $\delta$ and surface field $E_s$.

Equation (14) is substituted into Equation (8) and solved for surface field $E_s$ to obtain:

$$\frac{V_g - V_t}{e_s\left(\frac{T_{gin}}{e_{gin}} + \frac{\delta}{2e_s}\right)} = \frac{q}{e_s}\int_0^\delta N_{ac}(y)dy \quad (15)$$

Factor $\delta$ in (15) corresponds to effective flow depth of carriers in the Tub-FET channel, as shown in FIG. 3. Since effective gate capacitance $C_g^*$, F/cm² is given by:

$$C_g^* = \frac{1}{\left(\frac{T_{gin}}{e_{gin}} + \frac{\delta}{2e_s}\right)} \quad (16)$$

Equation (15) can be used to predict drain saturation current and its dependence on structure:

$$I_{sat} = ZVq\int_0^\delta N_{gac}(y)dy = C_g^* ZV(V_g - V_t) \quad (17)$$

Stated in words, saturation current depends on the product of effective gate capacitance $C_g^*$, channel width Z, carrier velocity V, and gate drive voltage $V_g - V_t$. Channel length $L_0$ does not appear directly in Equation (17). To reveal the role of channel length, an expression for carrier velocity V in Equation (17) is developed. Equation (17) is rewritten in terms of the product of carrier mobility $\mu$ and lateral field $E_1$:

$$I_{satn} = C_g^* ZV(V_g - V_t) = C_g^* Z\mu_n E_1(V_g - V_t) \quad (18)$$

For electrons:

$$\mu_n = \frac{\mu_{no}}{\sqrt{1 + \left(\frac{E_1}{E_c}\right)^2}} \quad (19a)$$

$$E_1 = \frac{V_p}{L} = \frac{V_g - V_t}{2L_o} \quad (19b)$$

$$E_c = \frac{V_{sat}}{\mu_{no}} \quad (19c)$$

$$\frac{E_1}{E_c} = \frac{(V_g - V_t)\mu_{no}}{2L_o V_{sat}} \quad (19d)$$

Substituting Equations (19a)–(19d) into Equation (17) a fundamental solution for drain saturation current is obtained:

$$I_{satn} = \frac{C_g^* Z(V_g - V_t)^2 \mu_{no}}{2L_o\sqrt{1 + \left(\frac{(V_g - V_t)\mu_{no}}{2L_o V_{sat}}\right)^2}} \quad (20)$$

where $C_g^*$ is given by Equation (16).

A similar expression for a P-Channel device is given by:

$$I_{satp} = \frac{C_g^* Z(V_g - V_t)^2 \mu_{po}}{2L_o\left[1 + \frac{(V_g - V_t)\mu_{po}}{2L_o V_{sat}}\right]} \quad (21)$$

For short N-channel devices and large gate drive, saturation current reduces to a simple equation independent of channel length and carrier mobility:

$$I_{sat} = C_g^* ZV_{sat}(V_g - V_t) \quad (22)$$

Accordingly, channel length $L_o$ below about one micron, plays only a minor role in determining drain saturation current of the Fermi-FET. The most fundamental control of saturation current is injector and insulator thickness, their relative permittivities, and effective flow depth $\delta$. The injector tub doping concentration and depth are chosen such that flow depth $\delta$ is adjusted to be greater than 200 Å.

Figure 4A:
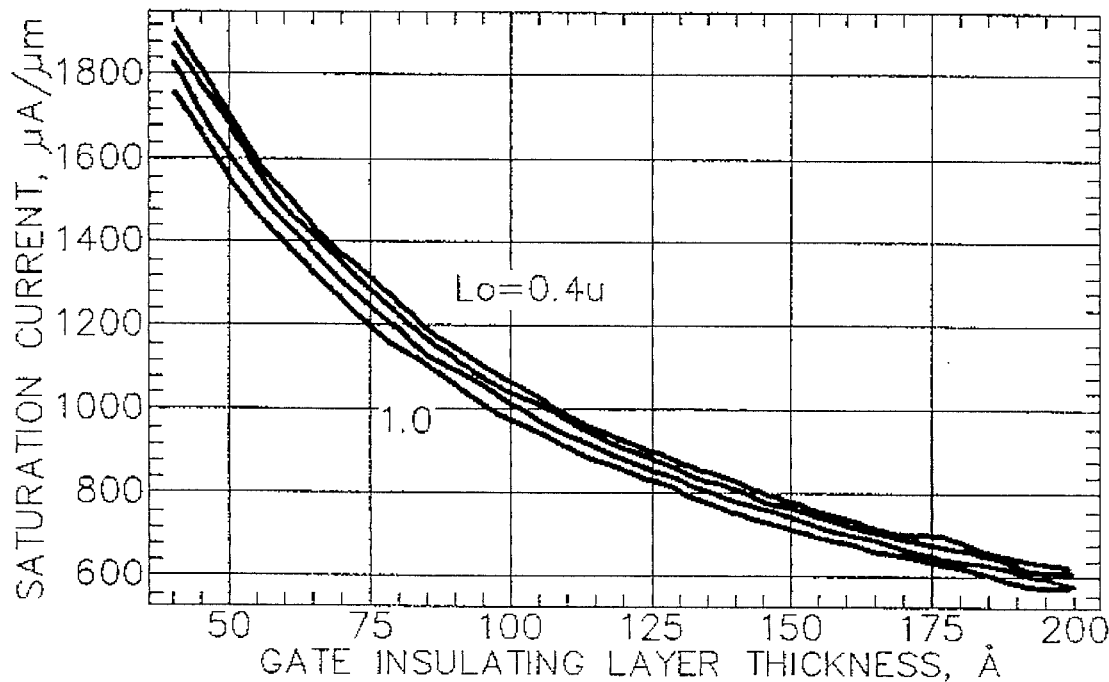
FIGS. 4A and 4B graphically illustrate simulated drain saturation current for N-channel and P-channel Fermi-FETs respectively, as a function of channel length and gate insulating layer thickness.
Figure 4B:
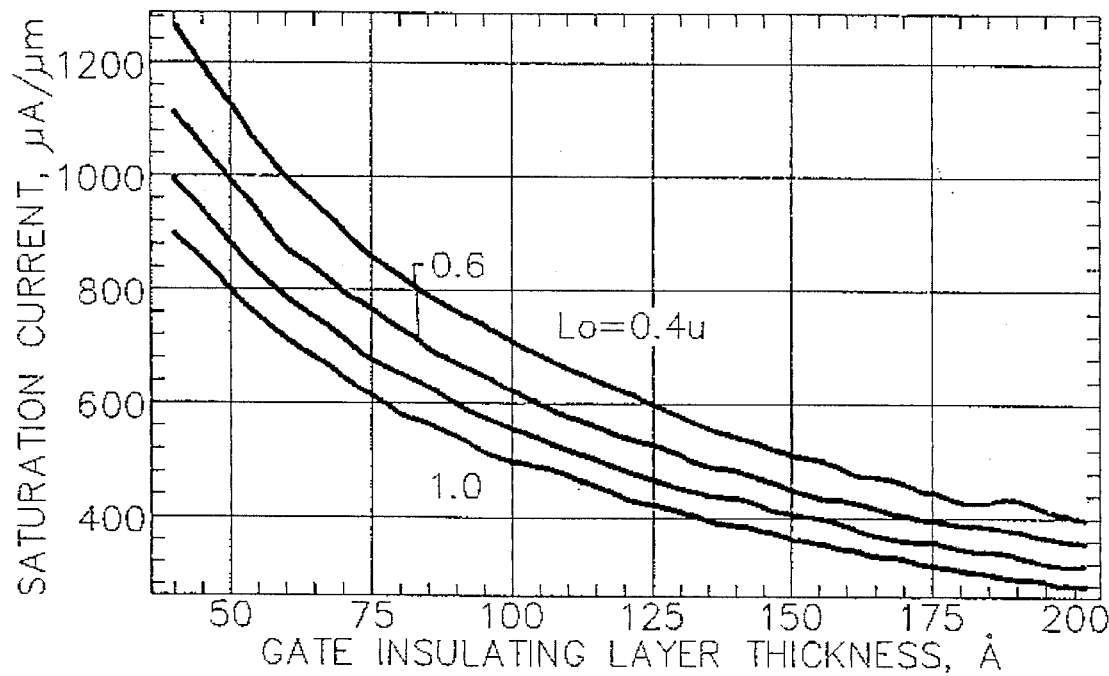
Figure 4C:
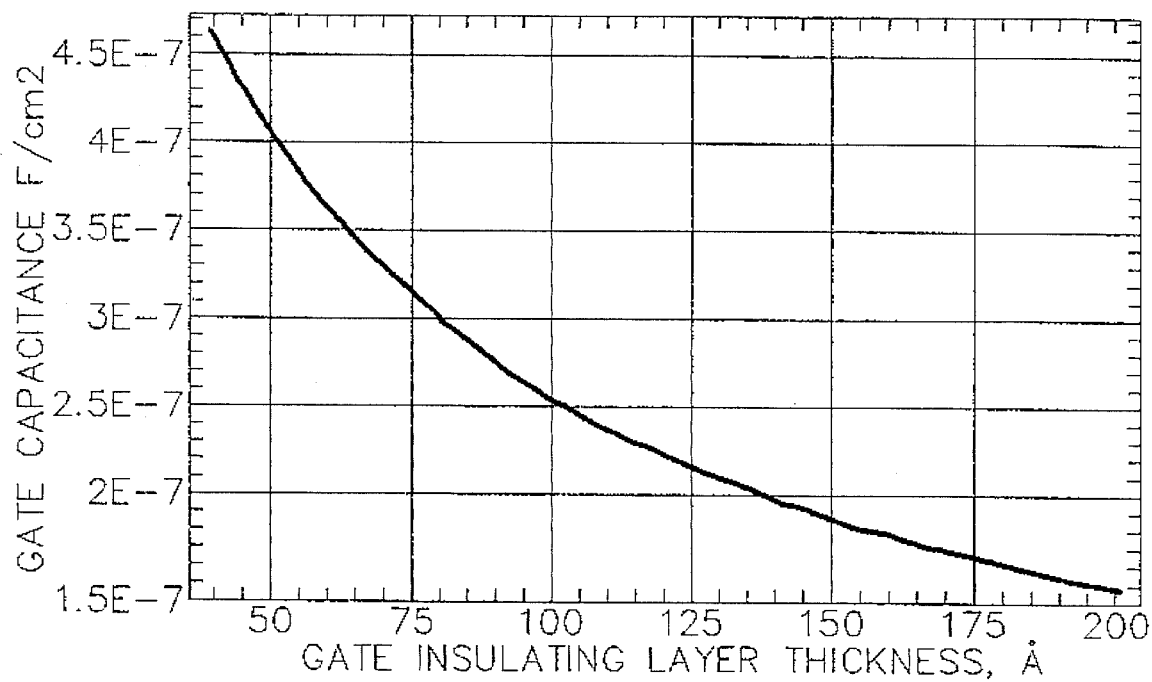
FIG. 4C graphically illustrates simulated gate capacitance versus gate insulating layer thickness for a Fermi-FET.

FIGS. 4A and 4B are plots of simulated drain saturation current for N and P-channel Tub-FET's as a function of channel length $L_o$ and gate insulating layer thickness $T_{gin}$. Note the relative insensitivity to N-channel length compared to insulator thickness. P-channel devices are more sensitive to channel length due to lateral field effects on hole velocity. FIG. 4C is a plot of simulated gate capacitance versus gate insulating layer thickness for $\delta=200$ Å.

When the following equation is satisfied in the design of a Tub-FET, the lowest pinch-off voltage with maximum saturation current and the least subthreshold bottom current are obtained for a given injector tub depth. This equation relates the permittivity of the injector 37, spacer 41 and gate insulator 26:

$$\frac{e_{ii}}{e_s} \left( \frac{(V_g - V_t)}{\beta T_{iin}} \right) \geq \frac{e_{gi}}{e_s} \left( \frac{(V_g - V_t)}{T_{gin}} \right) \quad (23)$$

From Equation (18) the following is also one of the Tub-FET design considerations:

$$\frac{e_{ii}}{e_{gi}} \geq \frac{\beta T_{iin}}{T_{gin}} \quad (24)$$

If $T_{iin} = T_{gin}$ then $$\frac{e_{ii}}{e_{gi}} \geq \beta \quad (25)$$

For practical high current Fermi-FET designs, one can use silicon nitride ($Si_3N_4$) for the gate sidewall spacer 41 and silicon dioxide ($SiO_2$) for the gate insulator 26. The permittivity of silicon nitride is 7E-13 F/cm, and silicon dioxide is 3.45E-13 F/cm. The ratio is greater than $\beta=1.5$. It will be shown subsequently that very high drive current Fermi-FET's, 1.6 ma/micron N-channel and 0.8 ma/micron P-channel devices, preferably use a 100 Å silicon nitride gate insulator. Unlike silicon dioxide insulators, silicon nitride insulators have high field strength, 1E7 V/cm, and therefore can be thin while maintaining high gate breakdown voltage while improving insulation integrity with time. For Fermi-FET devices that use a nitride gate insulator, the spacer and injector insulator can be nitride, but an injector and side-wall insulator material with twice the permittivity is preferred. It will also be understood by those having skill in the art that gate sidewall spacer 41 need not extend directly onto face 21a, but that a thin insulating layer, of a material other than that of the sidewall spacer 41, may be formed at interface 39 between injector 37 and sidewall spacer 41.

Figure 5A:
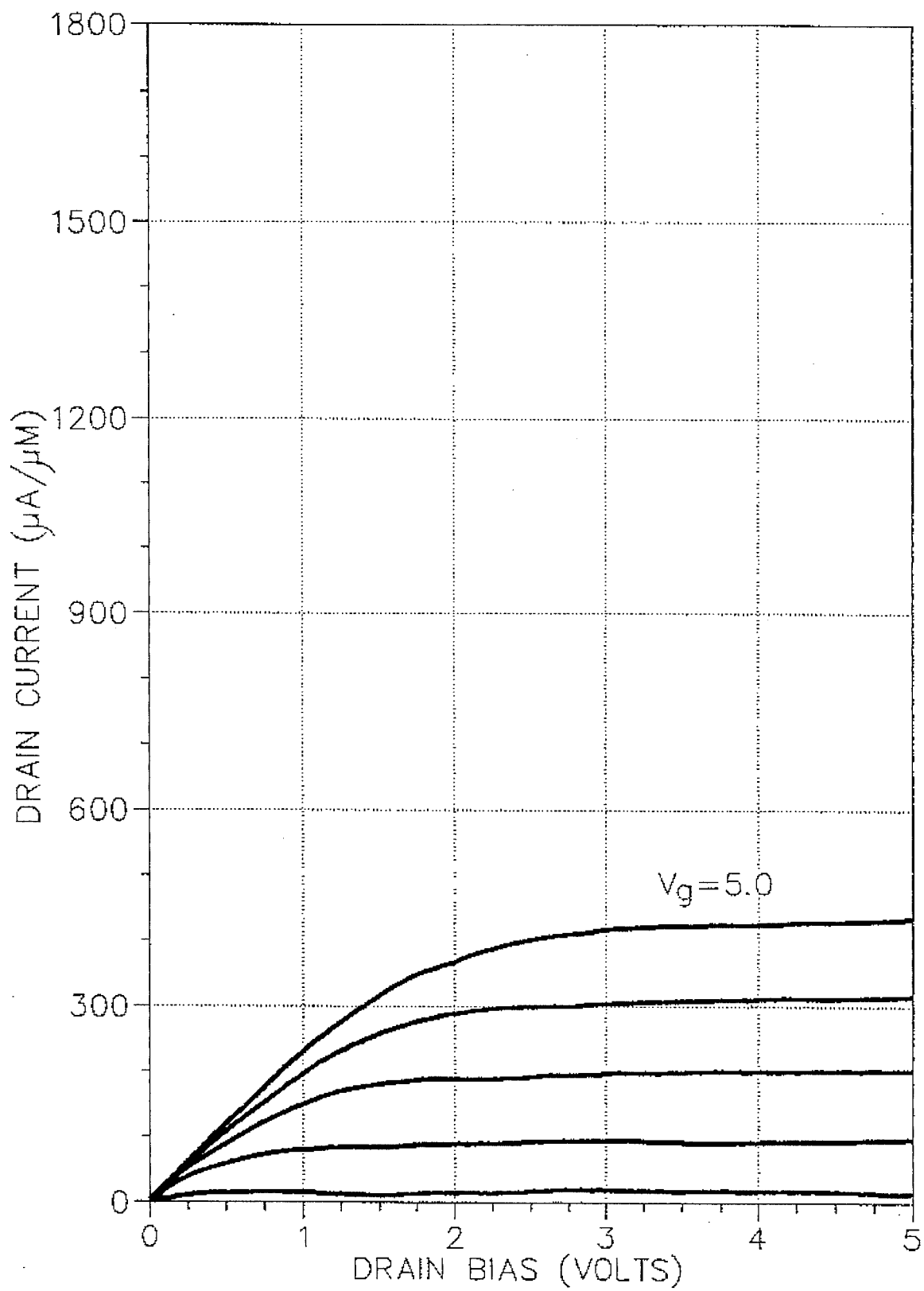
FIG. 5A graphically illustrates simulated transistor drain current characteristics of a conventional 0.8 μm N-channel MOSFET.
Figure 5B:
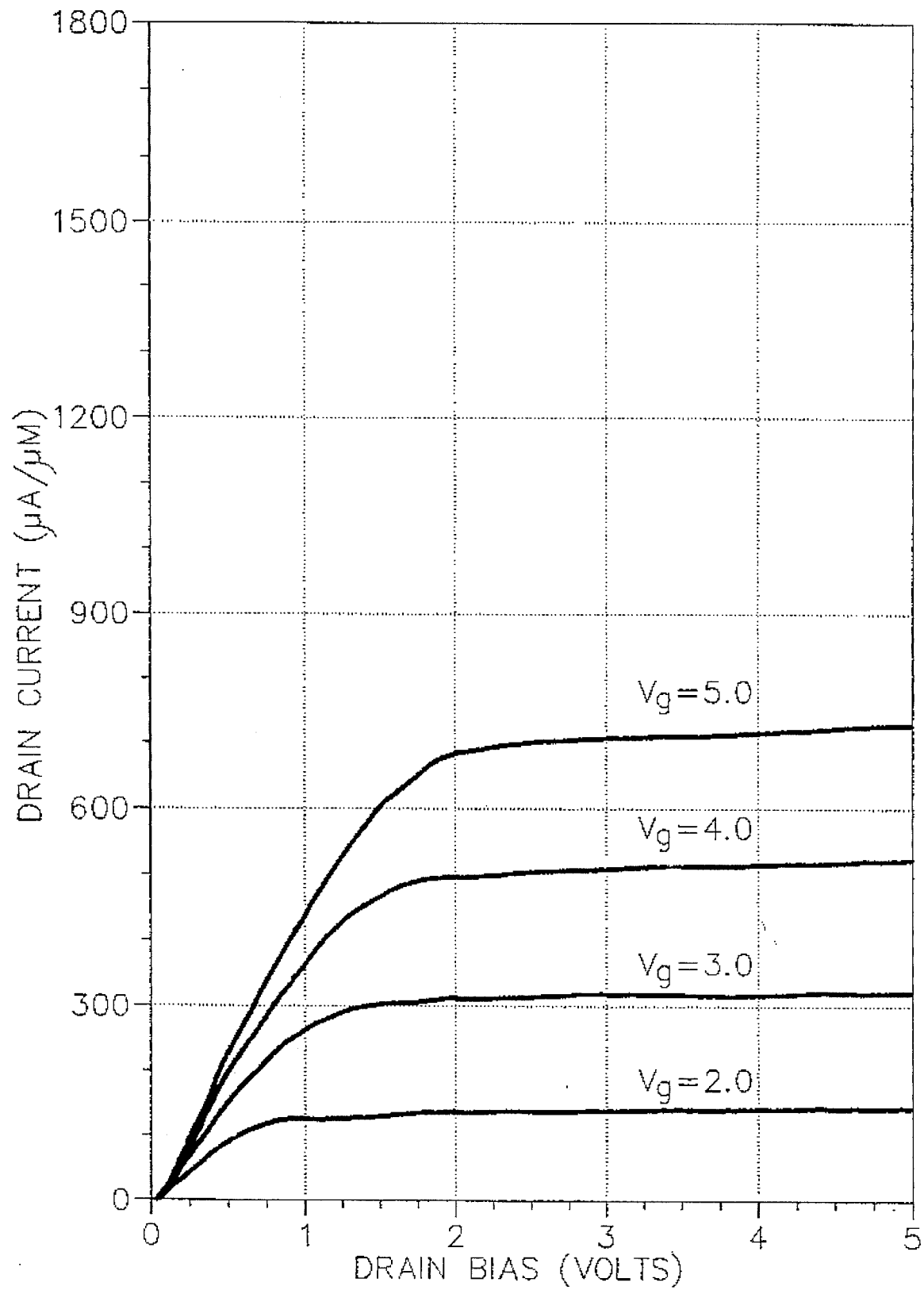
FIGS. 5B and 5C graphically illustrate simulated transistor drain current characteristics of a 0.8 μm N-channel high current Fermi-FET.
Figure 5C:
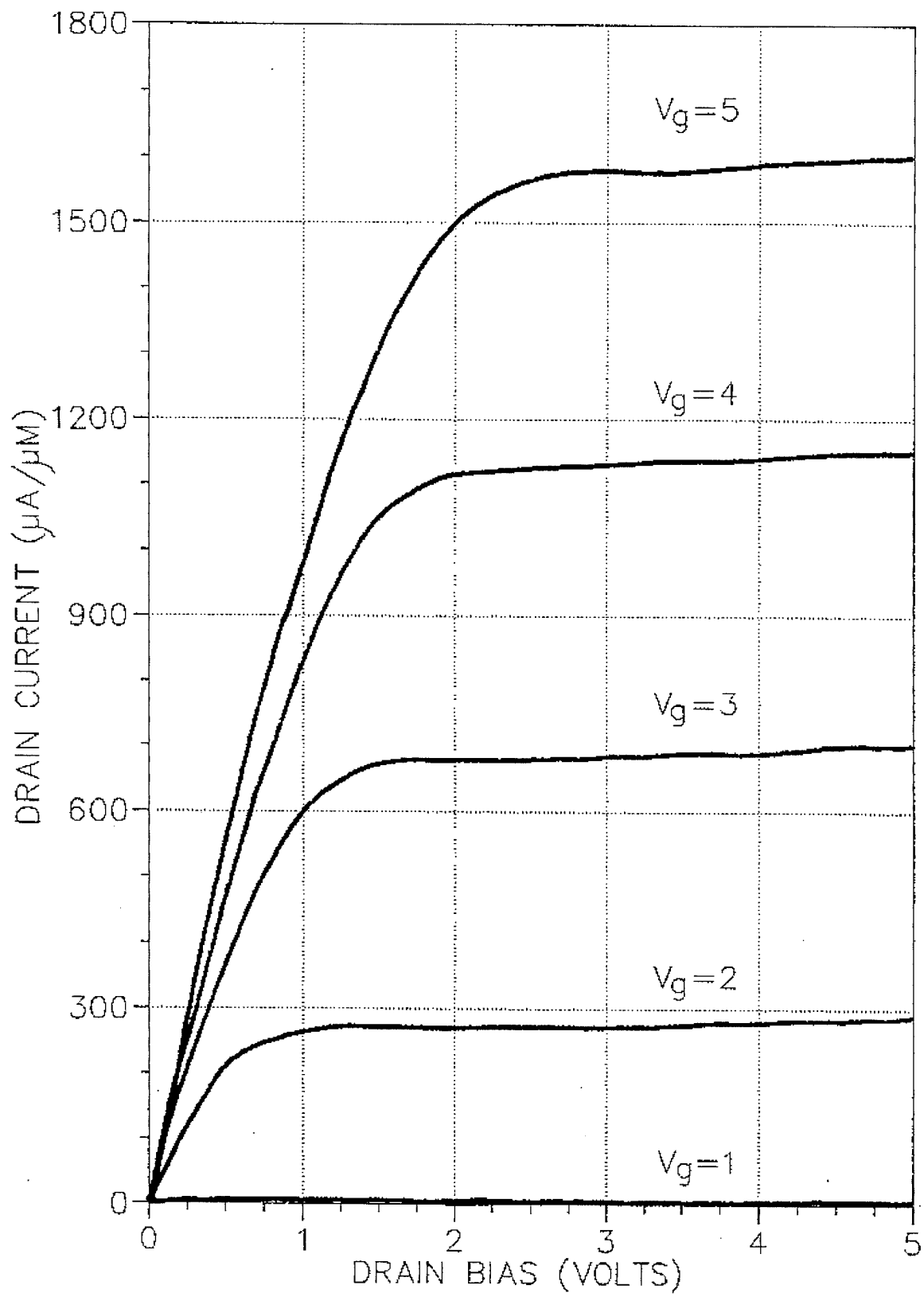

FIGS. 5B and FIG. 5C are simulations of the drain current performance of 0.8 micron N-Channel high current Fermi-FET devices. FIG. 5A is a similar simulation for a state of the art 0.8 micron MOS N-Channel device. FIG. 5A depicts 5 Volt MOS technology with a 150 Å $SiO_2$ gate insulator. FIG. 5B is a simulation of high current Fermi-FET performance with a 140 Å $SiO_2$ gate insulator. FIG. 5C is a simulation of high current Fermi-FET performed with a 100 Å silicon nitride gate insulator. In both cases, the drain current and pinch-off properties of high current Fermi-FET devices are far superior to MOS or buried channel technology. Similar dramatic improvement occurs for P-channel high current Fermi-FET devices compared to MOS or buried channel technology. P-channel saturation current is typically half N-channel saturation current, and pinch-off voltage is about twice the N-channel value.

Figure 6A:
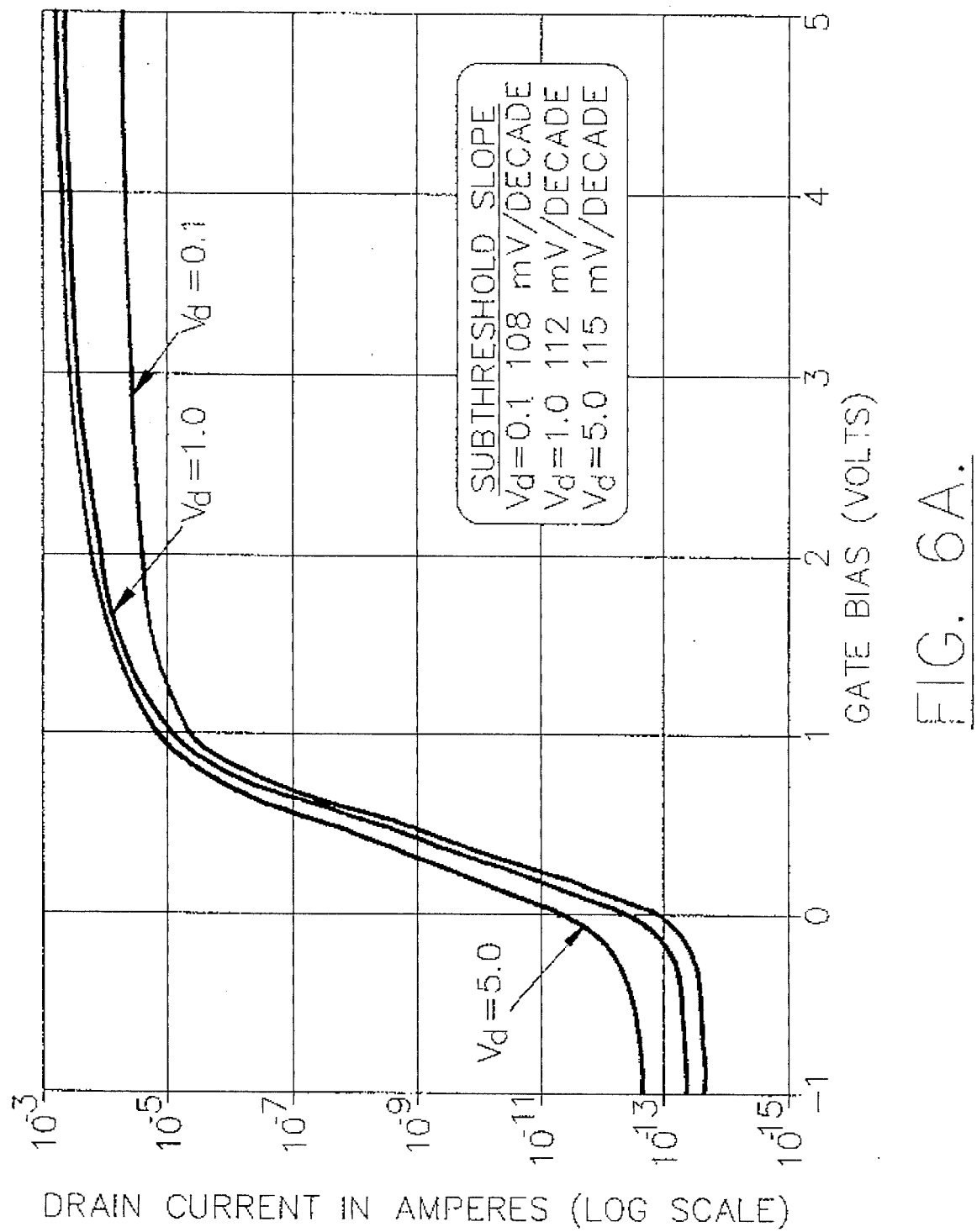
FIGS. 6A and 6B graphically illustrate simulated bottom current and subthreshold leakage behavior for N-channel and P-channel high current Fermi-FETs.
Figure 6B:
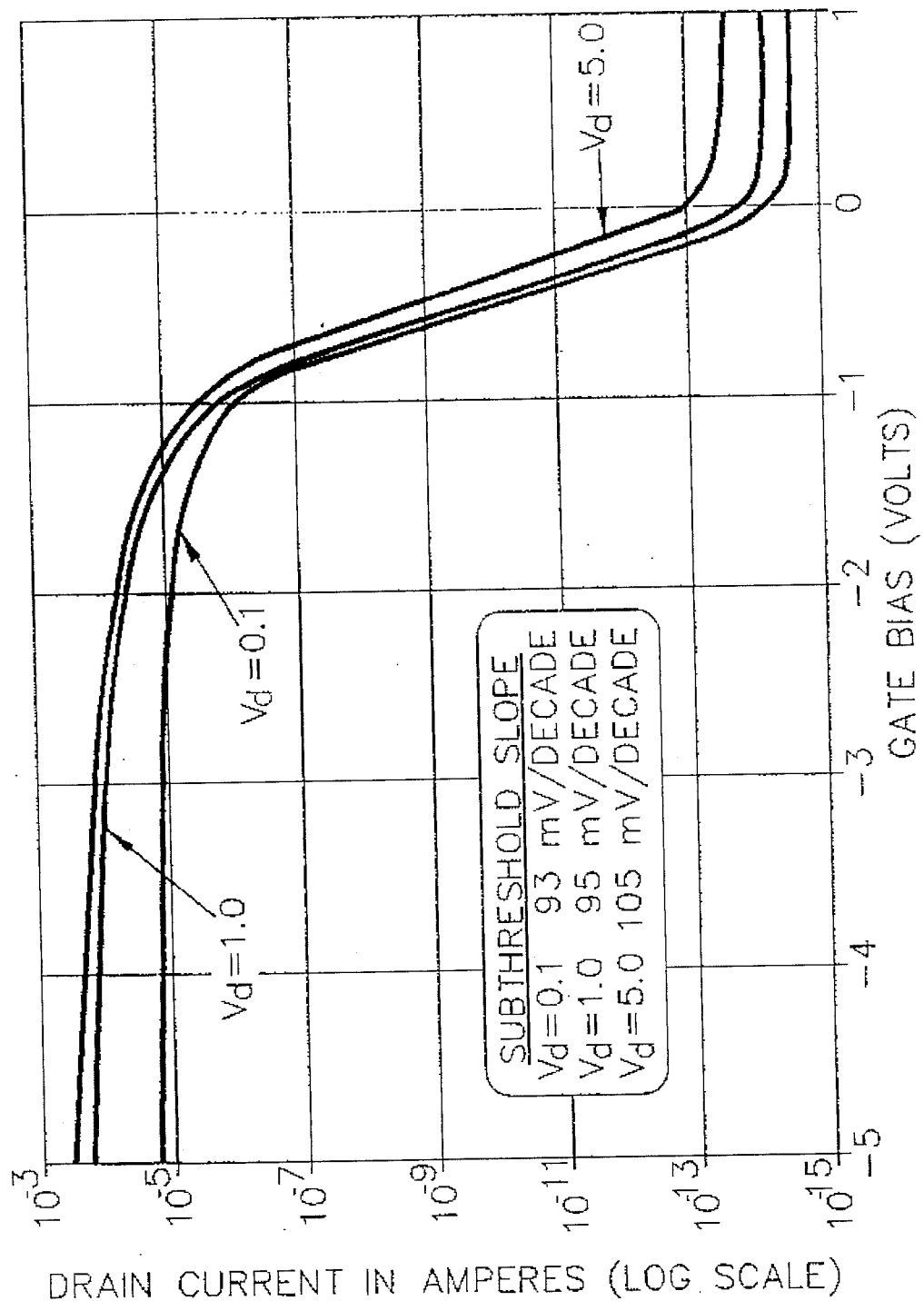

Typical bottom current and sub-threshold leakage behavior for the high current Fermi-FET devices of FIGS. 5B and 4C, are illustrated in FIGS. 6A and 6B. N-Channel high current Fermi-FET behavior is shown in FIG. 6A, and P-channel behavior in FIG. 6B. These figures illustrate N-channel current for an 0.8 μm transistor per μm width, and P-channel current for an 0.8 μm transistor per μm width, respectively. Bottom current is typically 2E-13 A/μm at 5 Volt drain bias at room temperature. This can be lowered to 2E-15 A/μm using the short channel techniques described below.

Figure 7:
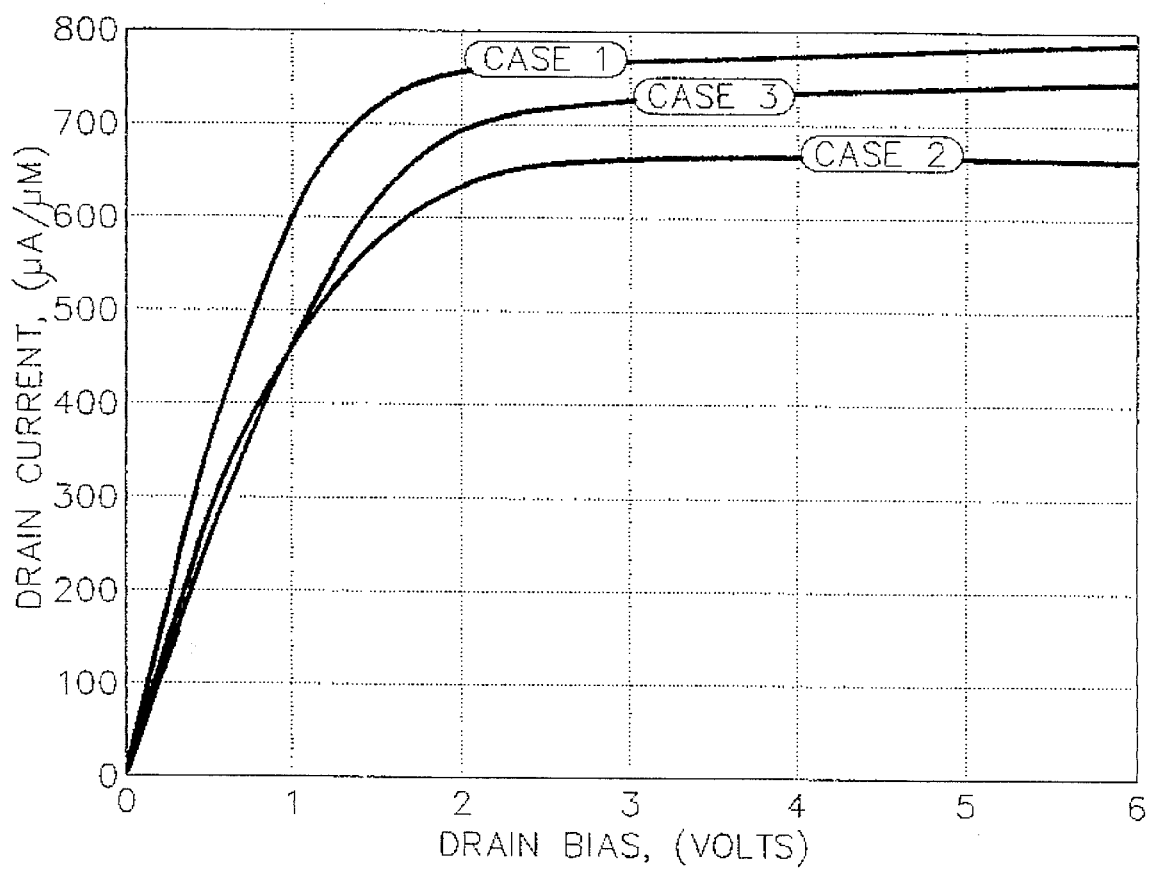
FIG. 7 graphically illustrates simulated worst case comparisons of drain current versus drain bias for different sidewall spacer structures in a high current Fermi-FET.

FIG. 7 illustrates a worst case simulated comparison plot of 5 Volt N-channel high current Fermi-FET drain current with different side-wall spacer structures 41 (FIG. 1). In all plots, the $SiO_2$ gate insulator 28 thickness is 132 Å. The different structures are illustrated in FIGS. 8A–8C.

Figure 8A:
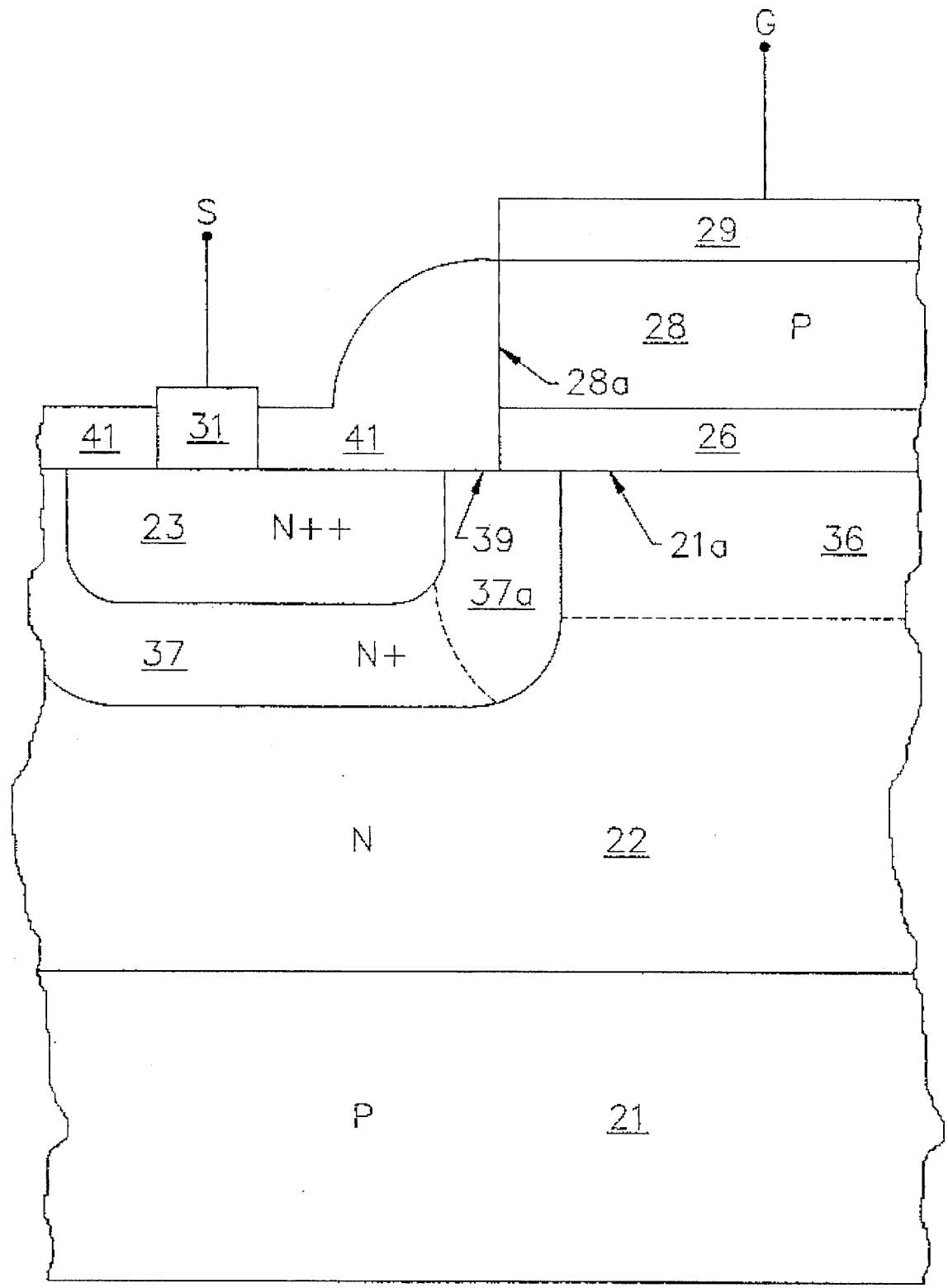
FIGS. 8A–8C illustrate enlarged cross-sections of the sidewall spacer structures which are graphically illustrated in FIG. 7.
Figure 8B:
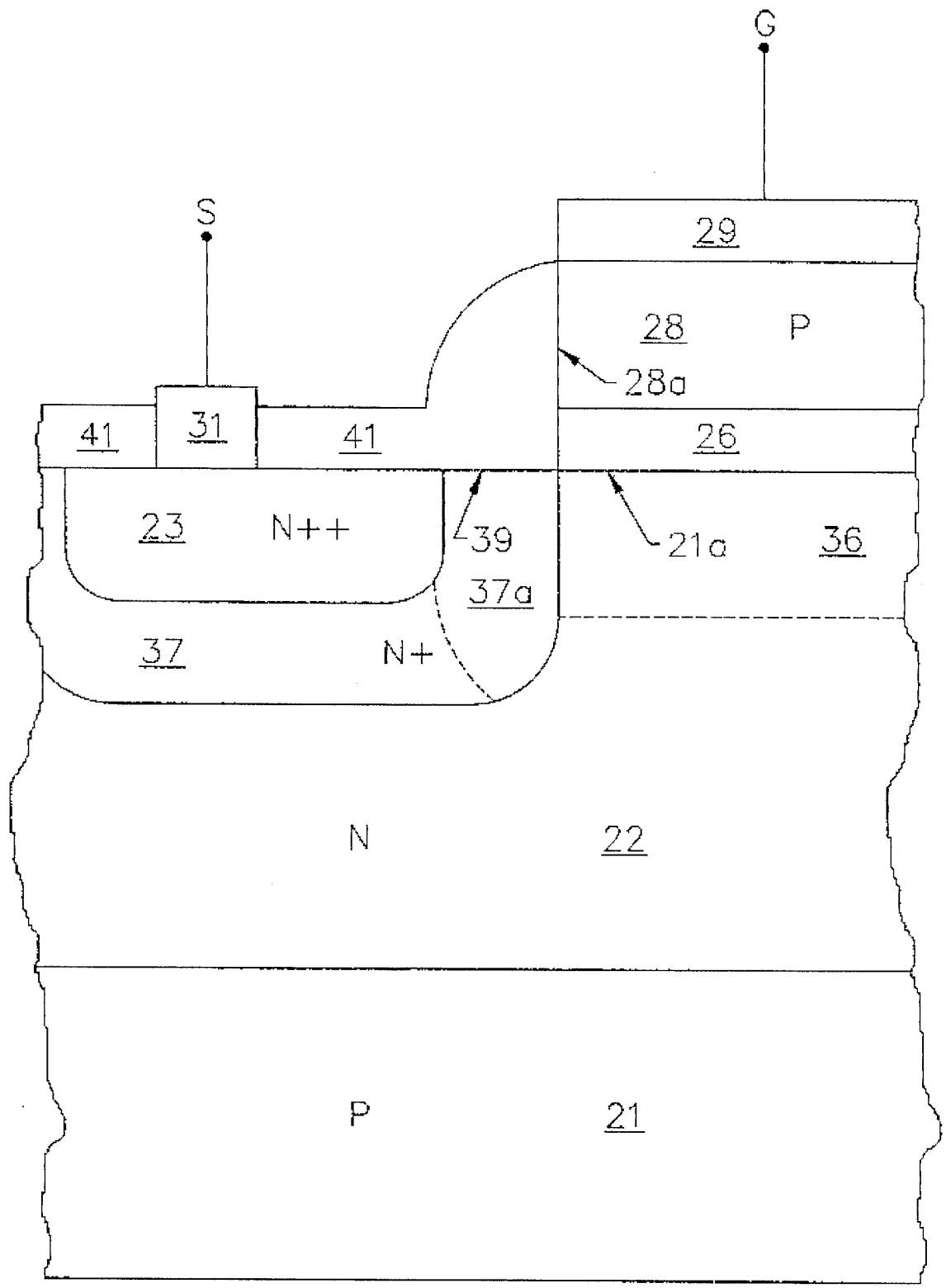
Figure 8C:
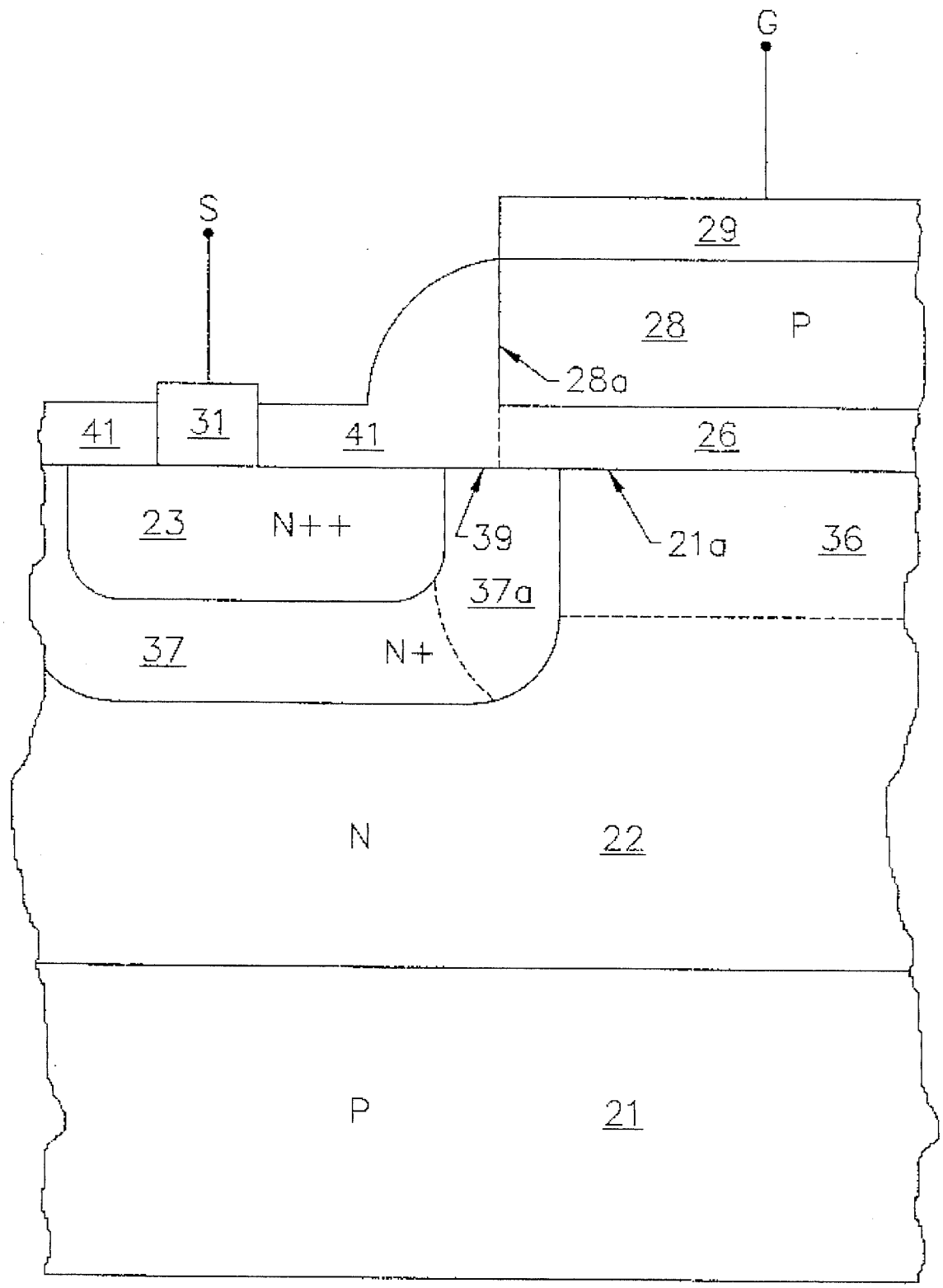

FIG. 8A illustrates Case 1 where the gate sidewall spacer 41 is silicon nitride, while the gate insulator 26 is silicon dioxide. The gate insulator 26 is also shown to slightly overlap the tip of the injector 37a at interface 39. Case 2, FIG. 8B, illustrates the gate sidewall spacer 43 as silicon nitride and the gate insulator 26 as silicon dioxide. In this case, the gate insulator 26 does not overlap the source injector region 37a at interface 39, but is contiguous with its edge. Case 3, FIG. 8C, illustrates both gate sidewall spacer 41a and gate insulator 43, of silicon dioxide. This structure is also constructed such that the edge of the polysilicon gate 28 slightly overlaps the source injector region 37a at interface 39. In all cases, the effective channel length was 0.71 μm.

As shown in FIG. 7, Case 1 produces the greatest drain saturation current with the least pinch-off voltage. It has also been found that Case 1 yields the lowest sub-threshold bottom current for any drain voltage. Case 1 also satisfies the conditions specified by Equations (24) and (25). Accordingly, Case 1 is preferred, so that the gate insulating region 26 extends partially over source injector region 37a at interface 39, and the gate sidewall spacer region 41 has greater permittivity than gate insulating region 26.

Low Leakage Current Fermi-Threshold Field Effect Transistor

Figure 9A:
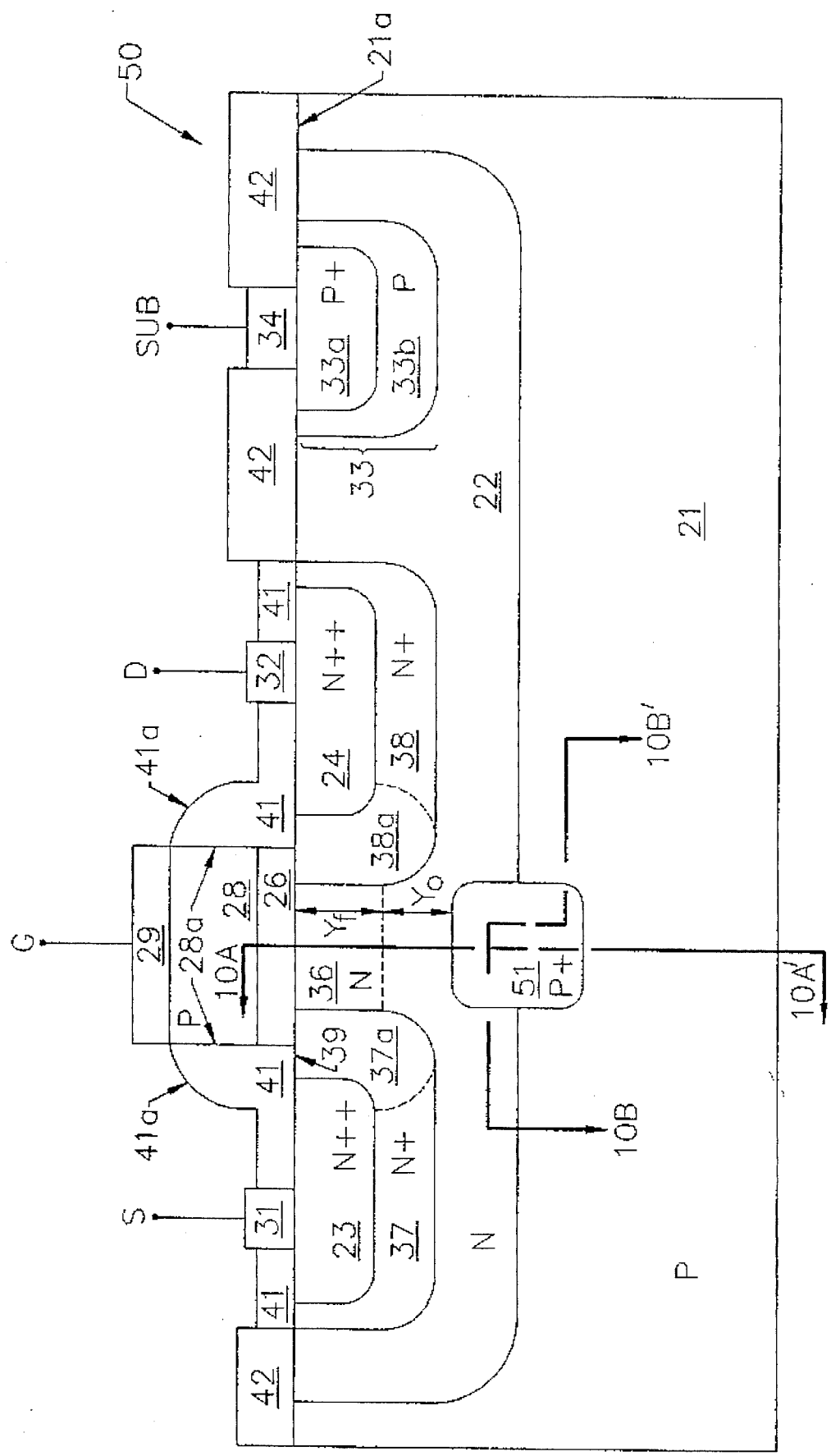
FIG. 9A illustrates a cross-sectional view of a first embodiment of a short channel low leakage current Fermi-FET according to application Ser. No. 08/037,636.
Figure 9B:
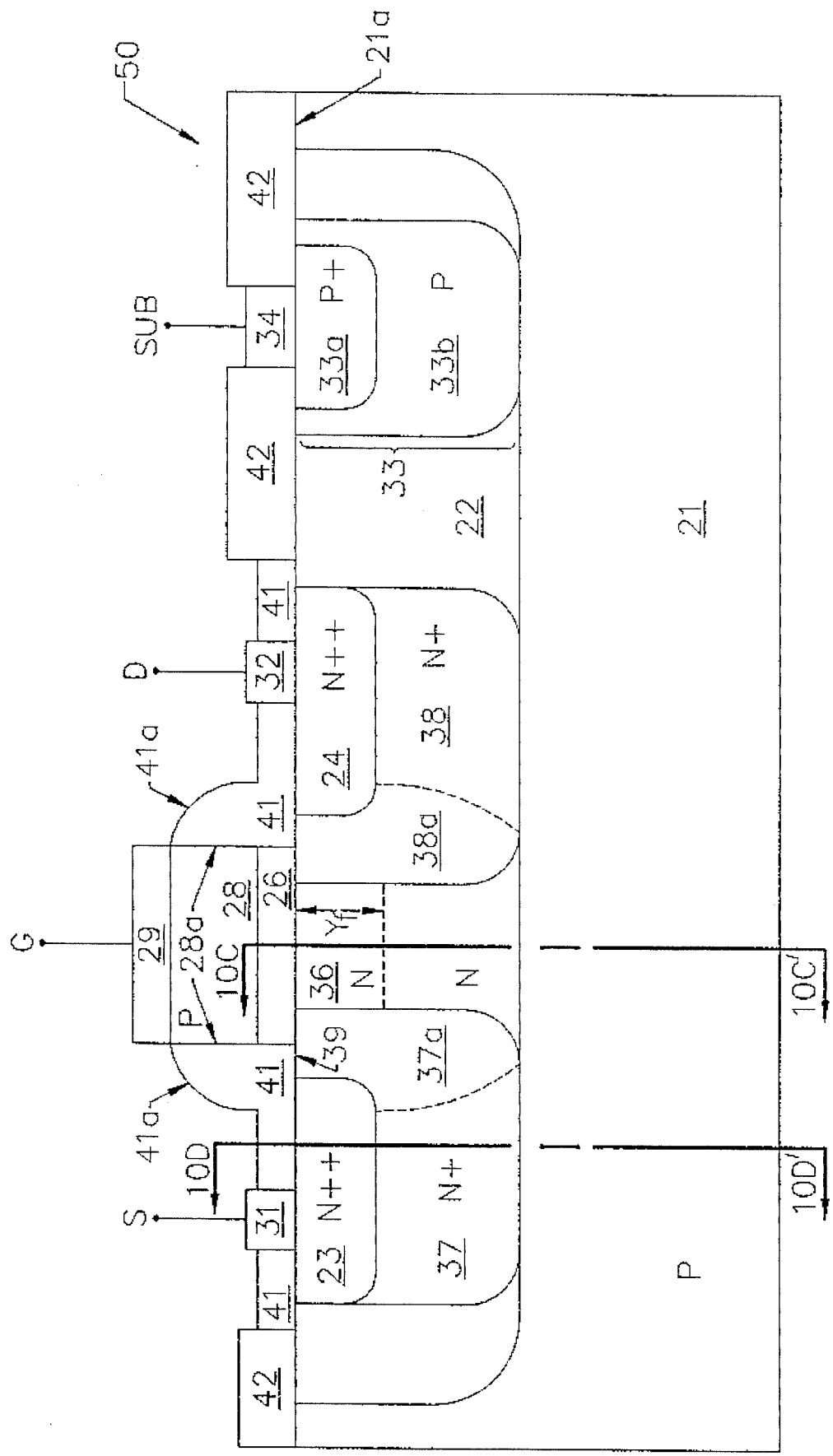
FIG. 9B illustrates a cross-sectional view of a second embodiment of a short channel low leakage current Fermi-FET according to application Ser. No. 08/037,636.

Referring now to FIGS. 9A and 9B, Fermi-FETs which have short channels yet produce low leakage current, will now be described. These devices will hereinafter be referred to as "low leakage current Fermi-FETs". The low leakage current Fermi-FET 50 of FIG. 9A includes a bottom leakage current control region 51 of first conductivity type, here P conductivity type, and doped at a high concentration relative to the substrate 21. Accordingly, it is designated as P+ in FIG. 9A. The low leakage current Fermi-FET 60 of FIG. 9B includes extended source and drain injector regions 37a, 38a, which preferably extend to the depth of the Fermi-tub 22.

Referring now to FIG. 9A, bottom leakage current control region 51 extends across the substrate 21 from between an extension of the facing ends of the source and drain regions 23 and 24, and extends into the substrate from above the depth of the Fermi-tub 22 to below the depth of the Fermi-tub. Preferably, it is located below, and in alignment with the Fermi-channel 36. For consistency with the equations previously described, the depth from the Fermi-channel 36 to the top of the bottom current leakage current control region 51 has been labeled $Y_0$. The remainder of the Fermi-FET transistor of FIG. 9A is identical with that described in FIG. 1, except that a shorter channel is illustrated. It will be understood by those having skill in the art that injector regions 37a and 38a and/or injector tubs 37 and 38 may be omitted, as may the gate sidewall spacer region 41, to provide a low leakage current low capacitance, short channel Fermi-FET without the high current properties of the device of FIG. 9A.

The bottom leakage current control region 51 minimizes drain induced injection in short channel Fermi field effect transistors, i.e. those field effect transistors having a channel length of approximately 0.5 μm or less, while maintaining low diffusion depletion capacitance. For example, at 5 volts, leakage current of 3E–13A or less may be maintained.

The bottom leakage current control region may be designed using Equation (2) where $Y_0$ is the depth from the channel to the top of the bottom leakage control region as shown in FIG. 9. Factor α is the ratio between the P+ doping of the bottom leakage current control region 51 and the N doping of the Fermi-tub 22. Preferably α is set to about 0.15 within the bottom leakage control region, i.e. below the gate 28. Below the source and drain regions 23 and 24, α is set to about 1.0 to minimize diffusion depletion capacitance. In other words, the doping concentrations of substrate 21 and Fermi-tub 22 are about equal in the regions below the source and drain. Accordingly, for the design parameters described above, and for a channel width of 0.5 micron, the doping concentration in the bottom leakage control region 51 is approximately 5E17 and is deep enough to support partial depletion at the tub-junction region given 5 volt drain or source diffusion potential.

Referring now to FIG. 9B, an alternate design for bottom leakage control extends the depth of source injector region 37a and drain injector region 38a, preferably to the depth of the Fermi-tub $(Y_f+Y_o)$. As shown in FIG. 9B, the depth of the entire source injector tub 37 and drain injector tub 38 may be extended, preferably to the depth of the Fermi-tub. The separation distance between the bottom of the injector tubs 37 and 38 and the bottom of the Fermi-tub 22 is preferably less than half the channel length and preferably approaches zero. Under these conditions, injector tubs 37 and 38 have doping concentration of about $1.5E18/cm^3$. The depth of substrate contact region 33b also preferably is extended to approach the Fermi-tub depth. The remainder of the Fermi-FET transistor 60 of FIG. 9B is identical with that described in FIG. 1, except that a shorter channel is illustrated.

Design of 0.5 μm Low Leakage Current Fermi-FET

Figure 10B:
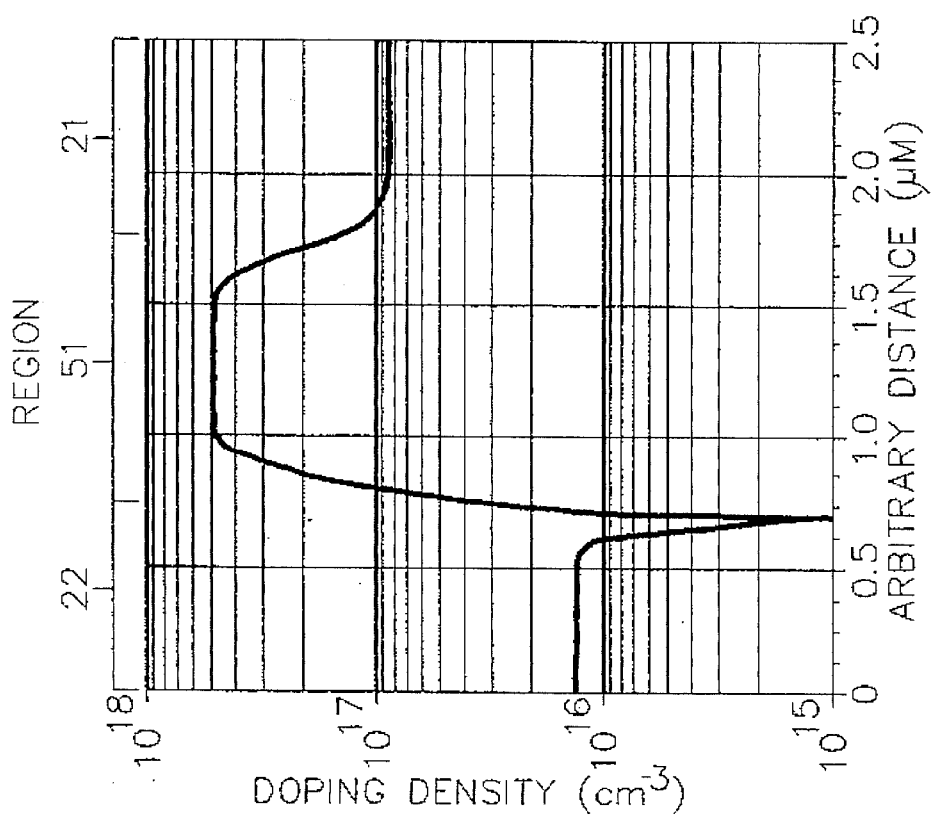
FIGS. 10A and 10B graphically illustrate preferred doping profiles and geometries for designing a 0.5 μm channel low leakage current Fermi-FET of FIG. 9A.
Figure 10A:
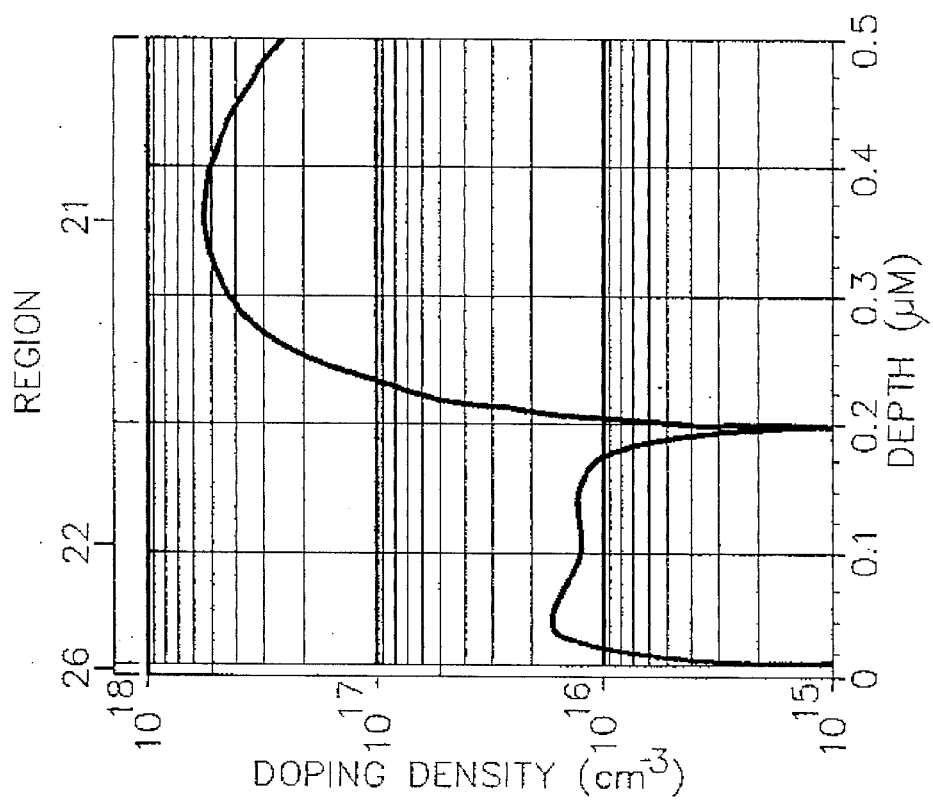

Referring now to FIGS. 10A–10B, preferred doping profiles and geometries for designing a 0.5 μm channel low leakage current Fermi-FET as illustrated in FIG. 9A will now be described. It will be understood by those having skill in the art that both N and P channel FETs are fabricated in a similar fashion. All geometries and doping profiles are identical to those described in FIGS. 2A–2C except that the length of channel region 36, between facing surfaces of injector regions 37a and 38a, is 0.5 μm rather than 0.8 μm, and the bottom leakage control current control region 51 is added as already described. It is well known to those having skill in the art how to achieve these doping profiles, using many well known techniques.

FIG. 10A illustrates a vertical doping profile along line 10A–10A' of FIG. 9A and centered about the channel 36. The region to which the profile applies is also labelled at the top of the horizontal axis of FIG. 10A. As shown, bottom current leakage current control region 51 extends from 1950 Å to 4000 Å in depth from the top face 21a of substrate 21. Accordingly, it is centered about the interface between Fermi-Tub 22 and substrate 21. Doping concentration is 5E17. In contrast with FIGS. 2A–2C, the substrate 21 is doped at 1E17.

FIG. 10B illustrates a doping profile along line 10B–10B' of FIG. 9A. As shown, bottom leakage current control region 51 extends horizontally between source injector region 37a and drain injection region 38a for about the same length as the channel length, i.e. about 0.5 μm.

Figure 10D:
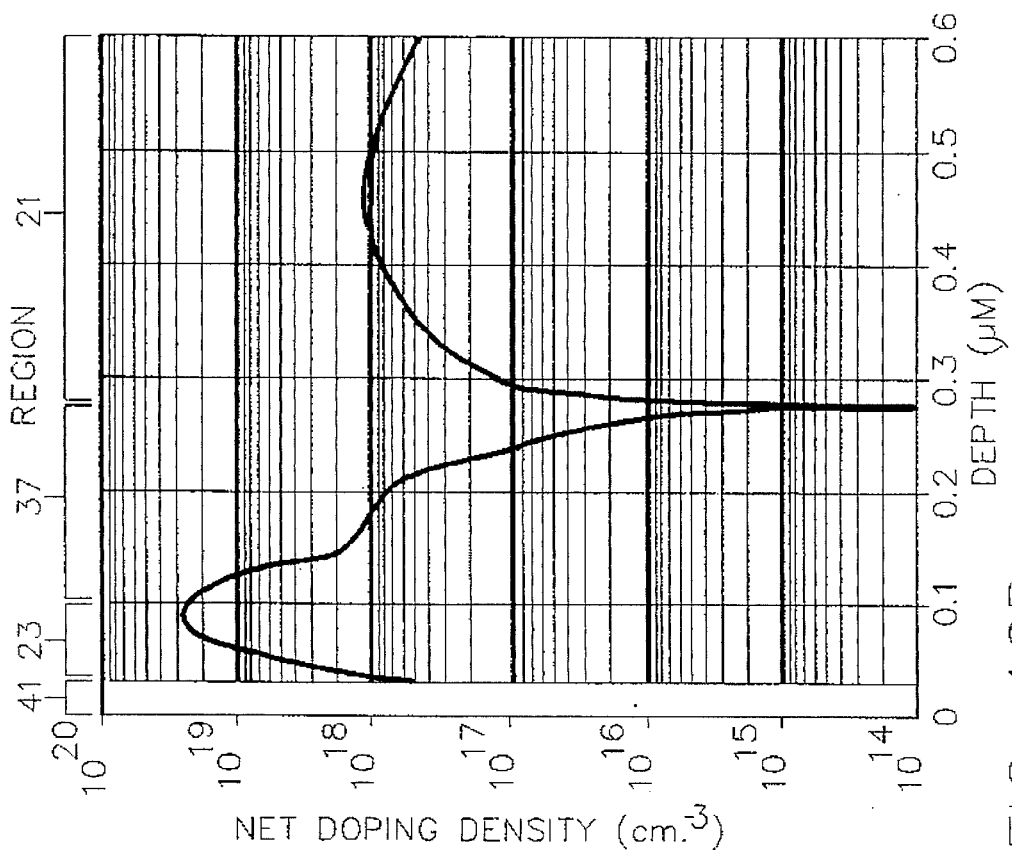
FIGS. 10C and 10D graphically illustrate preferred doping profiles and geometries for designing a 0.5 μm channel low leakage current Fermi-FET of FIG. 9B.
Figure 10C:
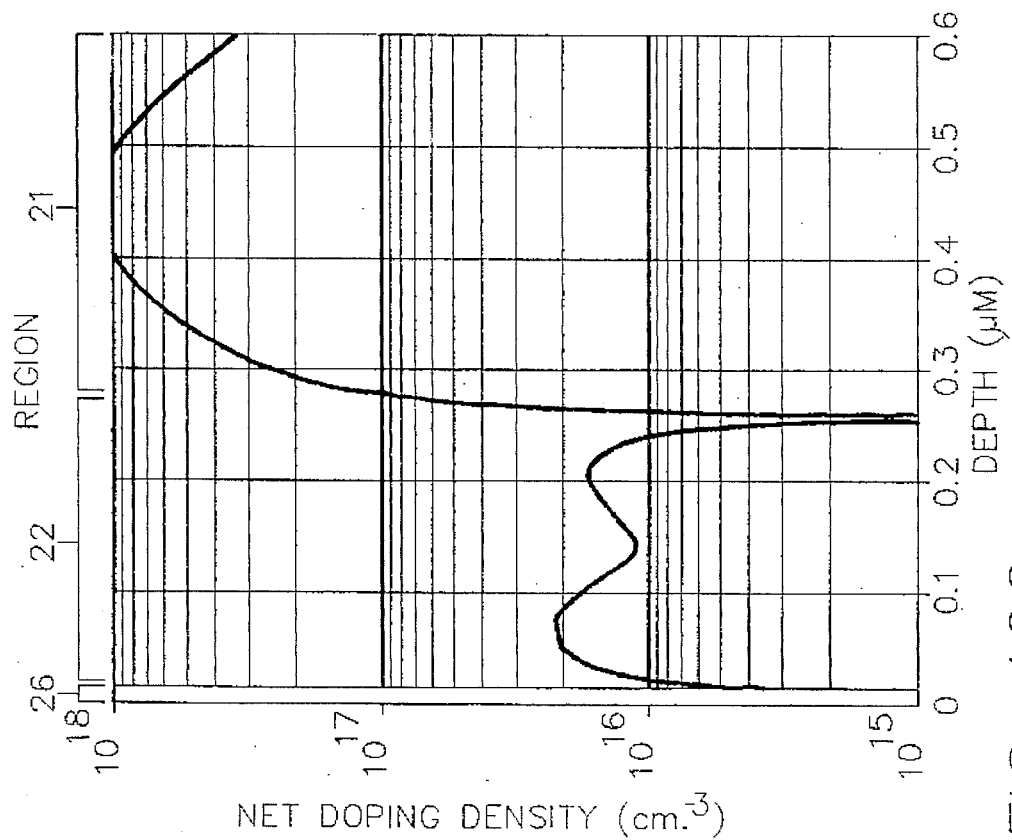

Referring now to FIGS. 10C–10D, preferred doping profiles and geometries for designing a 0.5 μm channel low leakage current Fermi-FET as illustrated in FIG. 9B will now be described. It will be understood by those having skill in the art that both N and P channel FETs are fabricated in a similar fashion. All geometries and doping profiles are identical to those described in FIGS. 2A–2C except that the depths of source injector region 37, drain injector region 38 and substrate contact 33b have been extended to the tub depth of about 2000 Å, and the length of channel region 36, between facing surfaces of injector regions 37a and 38a, is 0.5 μm rather than 0.8 μm.

FIG. 10C illustrates a vertical doping profile along line 10C–10C' of FIG. 9B and centered about the channel 36. As shown, substrate concentration is about 1E18. FIG. 10D illustrates a doping profile along line 10D–10D' of FIG. 9B. As shown, the source injector tub 37 extends to the depth of the Fermi-tub.

Operation of the Bottom Leakage Current Control Region

The operational theory of the bottom leakage current control region 51 of FIG. 9A, and the deep injection regions of FIG. 9B, to lower leakage current in short channel devices, will now be described. Subthreshold considerations will first be described to define the terms which apply to bottom leakage current. A discussion of how injector tub depth influences bottom leakage current will then be provided as well as a discussion of drain induced injection and drain field threshold lowering.

Figure 11:
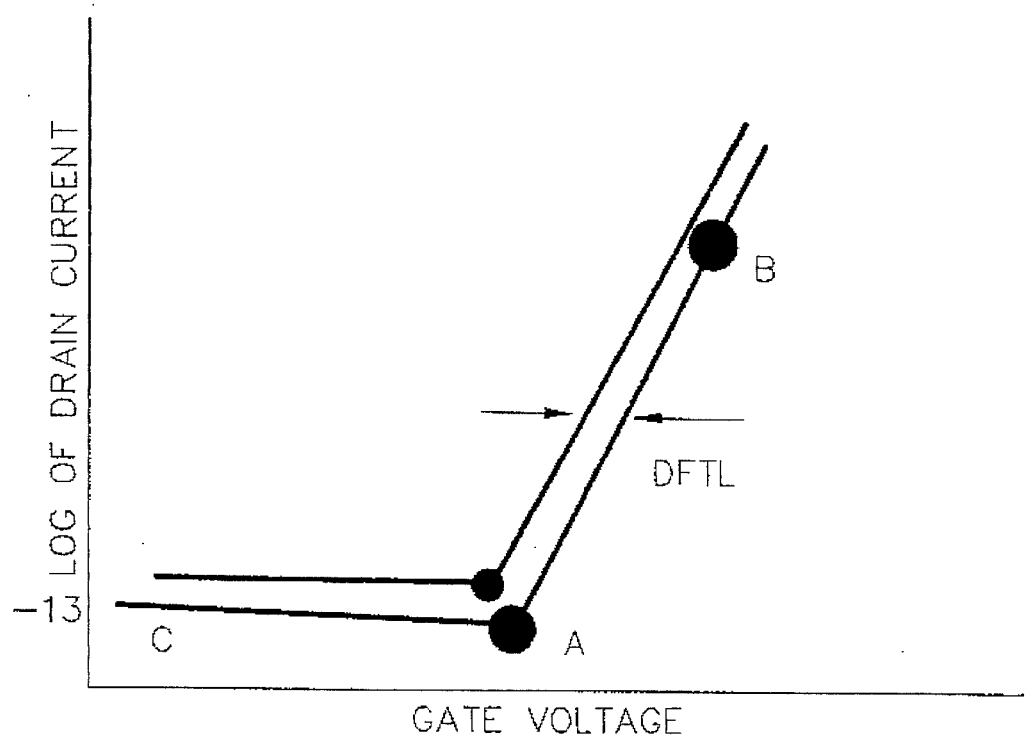
FIG. 11 graphically illustrates basic subthreshold voltage-current behavior of a field effect transistor.
Figure 13:
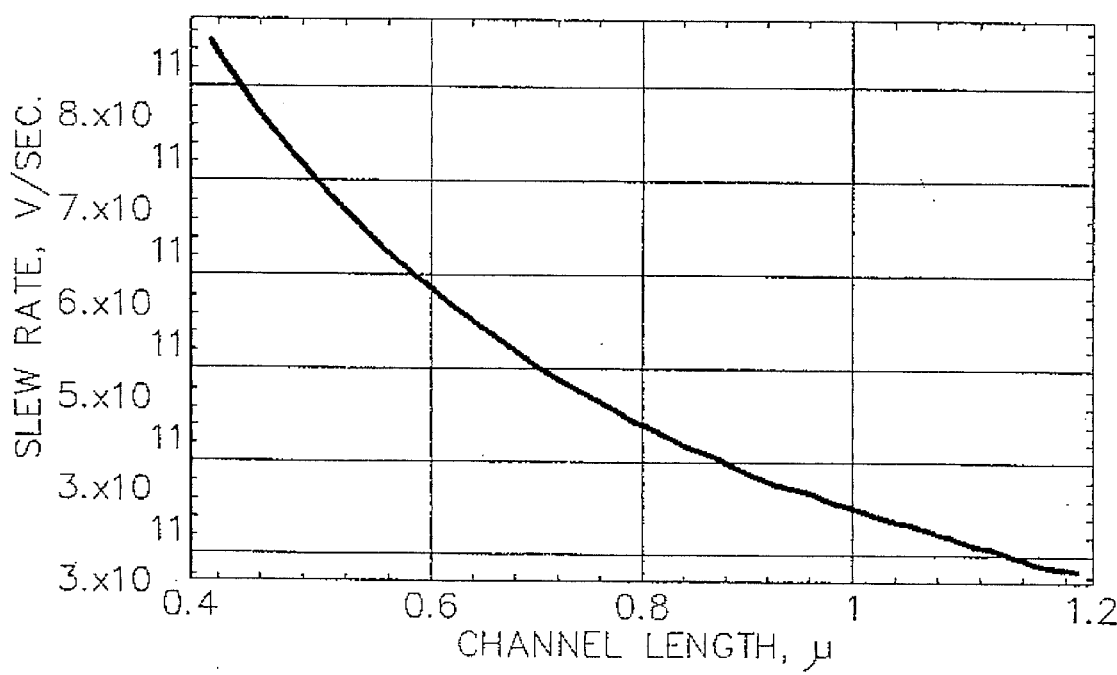
FIG. 13 graphically illustrates simulated theoretical limits for gate slew rate of a field effect transistor.

In solving the equations that describe the sub-threshold behavior of the Fermi-FET, some new definitions are needed. FIG. 11 graphically illustrates basic behavior. There are four primary features of sub-threshold current behavior. These behavior regions are labeled A, B, and C and $D_{FTL}$ in FIG. 11. Point A defines "sub-threshold threshold, $V_{stt}$. Point B defines normal conduction threshold. Point C defines "bottom leakage current" as influenced by drain voltage. Finally, the arrows for $D_{FTL}$ defines "drain field threshold lowering". Sub-threshold threshold occurs when the injecting gate field is zero.

Referring again to FIGS. 9A and 9B, bottom leakage current dependence on drain voltage is a result of a drain field component that terminates on the source injector diffusion 37a facing the channel 36. This source terminated drain field causes carrier injection into the channel 36. This sub-threshold effect is called "drain induced injection", DII.

DII is a characteristic property of majority carrier Fermi-FET and buried channel field effect devices. Below threshold, the majority carrier channel 36 and Fermi-tub region 22 do not contain charge sites that prevent the drain field from extending across the channel region. As a consequence, the drain field can terminate in the source depletion region facing the channel and cause injection.

In contrast, minority carrier MOS devices require the substrate region to intercede between the source and drain. Drain field is therefore terminated by ionizing the substrate region adjacent the drain diffusion facing the channel. If the substrate region is completely depleted between the source and drain diffusions, the well known punch-through phenomenon occurs leading to abrupt and high injection current.

In summary, MOS device design is troubled by punch-through and threshold problems. Buried channel devices are troubled by both punch-through and DII. However, Fermi-FET devices are troubled only by DII conditions, which can be substantially reduced by the bottom leakage current control region or by increasing the depth of the injector regions 37 and 38. The significant current and speed advantages of the Fermi-FET compared to MOS and buried channel devices far outweigh the design constraints needed to control DII in the former as opposed to eliminating punch-through and threshold troubles in the latter. Both problems become more significant as channel length is shortened.

The following analysis describes the impact of injector depth $Y_d$ on diverting drain field contour lines in majority carrier Fermi-FET devices. The bottom leakage current control region 51 of FIG. 9A or the deep injector tubs of FIG. 9B virtually eliminate DII.

Figure 12A:
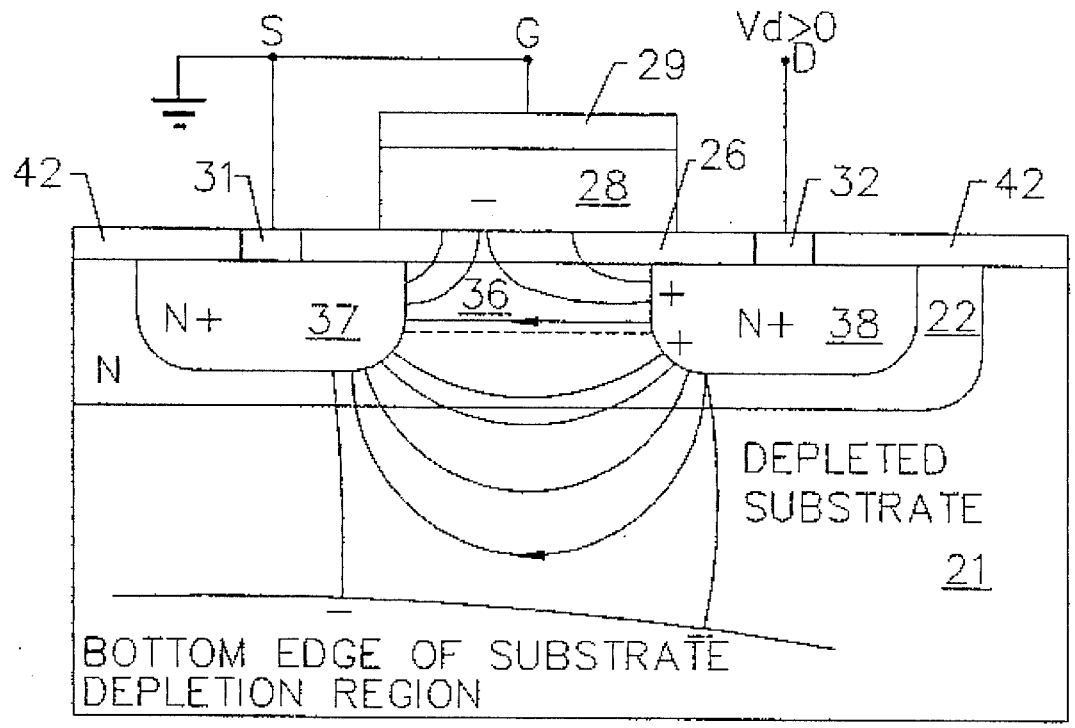
FIGS. 12A and 12B are enlarged cross-sectional views of a field effect transistor illustrating drain induced injection.
Figure 12B:
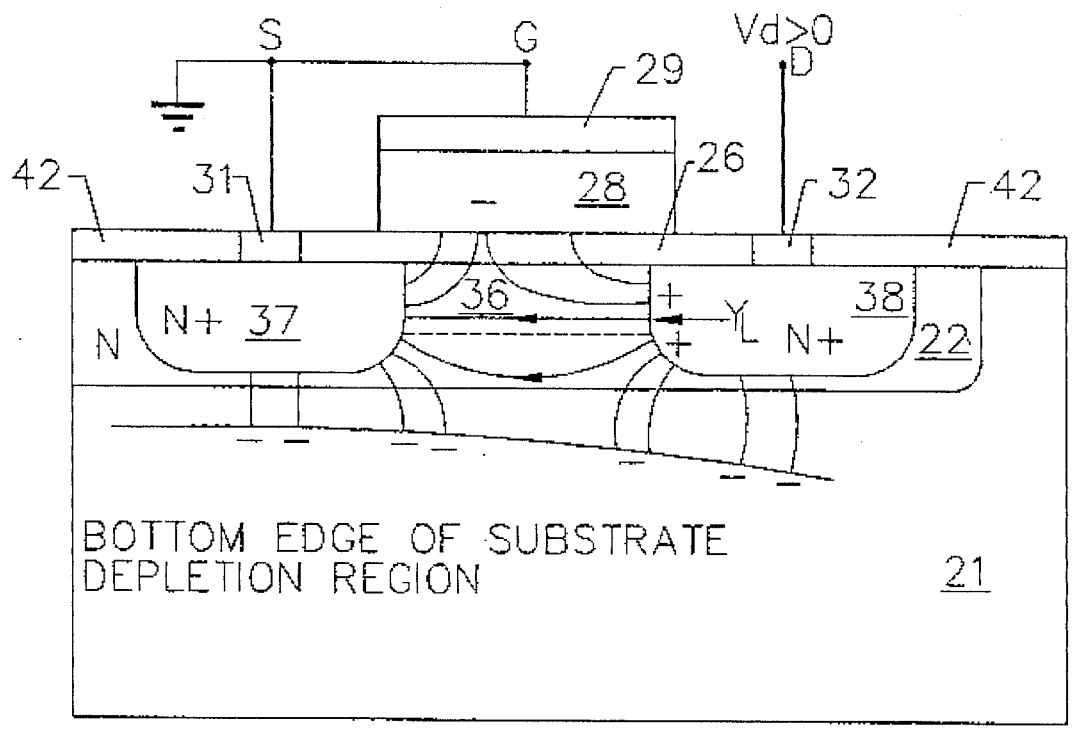

FIG. 12A illustrates field contour lines that occur when Drain Induced Injection becomes a problem in a low capacitance Fermi-FET, including a Fermi-tub 22 and injectors 37, 38 and no sidewall spacer 41. Specifically, the bottom corner region of the injector tubs contribute to excessive DII due to field crowding there. FIG. 12B illustrates proper corrective measures that minimize the effect, by moving the bottom edge of the substrate depletion region 21 closer to the bottom of the source and drain injector tubs 37, 38. The bottom current leakage control region 51 of FIG. 9A also accomplishes this result.

There exists some depth $Y_L$ at the drain injector 38 facing the channel 36 at which the contour integral of the drain electric field terminating on poly gate surface 28 equals the contour integral of the drain field terminating in the substrate region 21. At that point, drain field can terminate at the source 23, facing the channel region. There is an injector tub depth that minimizes the number of field lines that can terminate on the source injector 38. This requirement suggests that $\alpha$ be less than 1. Typically, $\alpha < L_o/2$. When designing Fermi-FET devices, Equation (31) derived below, should be considered. Predicted depth $Y_L$ should not exceed the depth of the injector, otherwise considerable bottom leakage current will flow from the bottom and corners of the diffusions in the subthreshold regime. Equation (32) derived below, produces minimum bottom current.

Equation (32) also predicts the basic design criteria for the original Fermi-FET as defined by U.S. Pat. Nos. 4,990,974 and 4,984,043. Specifically, when $Y_{tub}=Y_o$ and $Y_o=Y_p$, then $\alpha=1$ and $Y_L=Y_o$. In other words, for that case, the diffusion depth $Y_d$ should be the same as the Fermi channel depth $Y_o$. $Y_p$ is the depletion depth in the substrate region.

Equation (32) will now be derived. Let $R_1$ be an effective radius for the field lines that terminate on the polysilicon gate electrode 28. Let $R_2$ be an effective radius for the field lines that terminate in the substrate region 21. Let $E_d$ be the drain field along these field lines. The electric field between diffusions is nearly uniform in the sub threshold region as compared to the electric field that terminates in the substrate region below the diffusions.

$$\frac{\pi}{2} R_1 E_{sd} + T_{ox} E_{sd} \frac{e_s}{e_i} = V_d + V_{pj} \quad (26)$$

$$\frac{\pi}{2} R_2 E_{sd} = V_d + V_w \quad (27)$$

$$R_2 = Y_{tub} + Y_p - Y_L \quad (28)$$

$$R_1 = Y_L \quad (29)$$

Using Equations (26)–(29) the following expression is obtained:

$$E_d \left[ \frac{\pi}{2} (R_1 - R_2) + \frac{e_s}{e_i} T_{ox} \right] + V_w - V_{pj} = 0 \quad (30)$$

where $V_w$=well potential $KT/q \ln(N^*/N_s)$, and $V_{pj}$=polysilicon gate electrode junction potential $KT/q \ln(N^*/N_{poly})$
If $V_w = V_{pj}$, then:

$$Y_L \geq \frac{Y_{tub} + Y_p - \frac{2e_s}{\pi e_i} T_{ox}}{2} \quad (31)$$

Equation (31) is independent of field strength $E_d$. Substrate depletion depth $Y_p$ should be small by design.

Punch-through is a serious problem for short channel MOS and buried channel devices. High substrate doping is required to minimize the effect. In all FET structures, a second drain induced phenomenon occurs: "drain field threshold lowering", DFTL. Simply explained, DFTL is the result of insulator potential developed near the source end of the channel as a result of the electric field produced by drain voltage that is terminated by the gate when gate voltage is below drain voltage. This drain induced insulator potential is always in a direction to reduce threshold voltage. Punch-through is eliminated by the low capacitance Fermi-FET, however DFTL remains. An expression for the change in threshold voltage $\Delta V_t$ due to DFTL is given below and only applies when drain voltage is greater than gate voltage:

$$\Delta V_t = \frac{V_d - (V_g - V_{fb})}{1 + \frac{e_i(L_o + X_d)}{e_s T_{ox}}} \quad (32)$$

where $L_o$ is channel length and $X_d$ is diffusion depth.

The effects of DFTL increase by the amount drain voltage exceeds gate voltage and is more pronounced at low gate voltage as channel length is shortened. Thinning down gate insulator thickness proportionately reduces the effect.

A method of experimentally measuring the effects of DFTL is to plot sub-threshold behavior of the device. See FIGS. 6A and 6B. DFTL accounts for the left voltage translation of the rising curve, $\text{Log}_{10} I_{ch}$, with increasing drain voltage $V_d$.

Contoured-Tub Fermi-Threshold Field Effect Transistor

Figure 14:
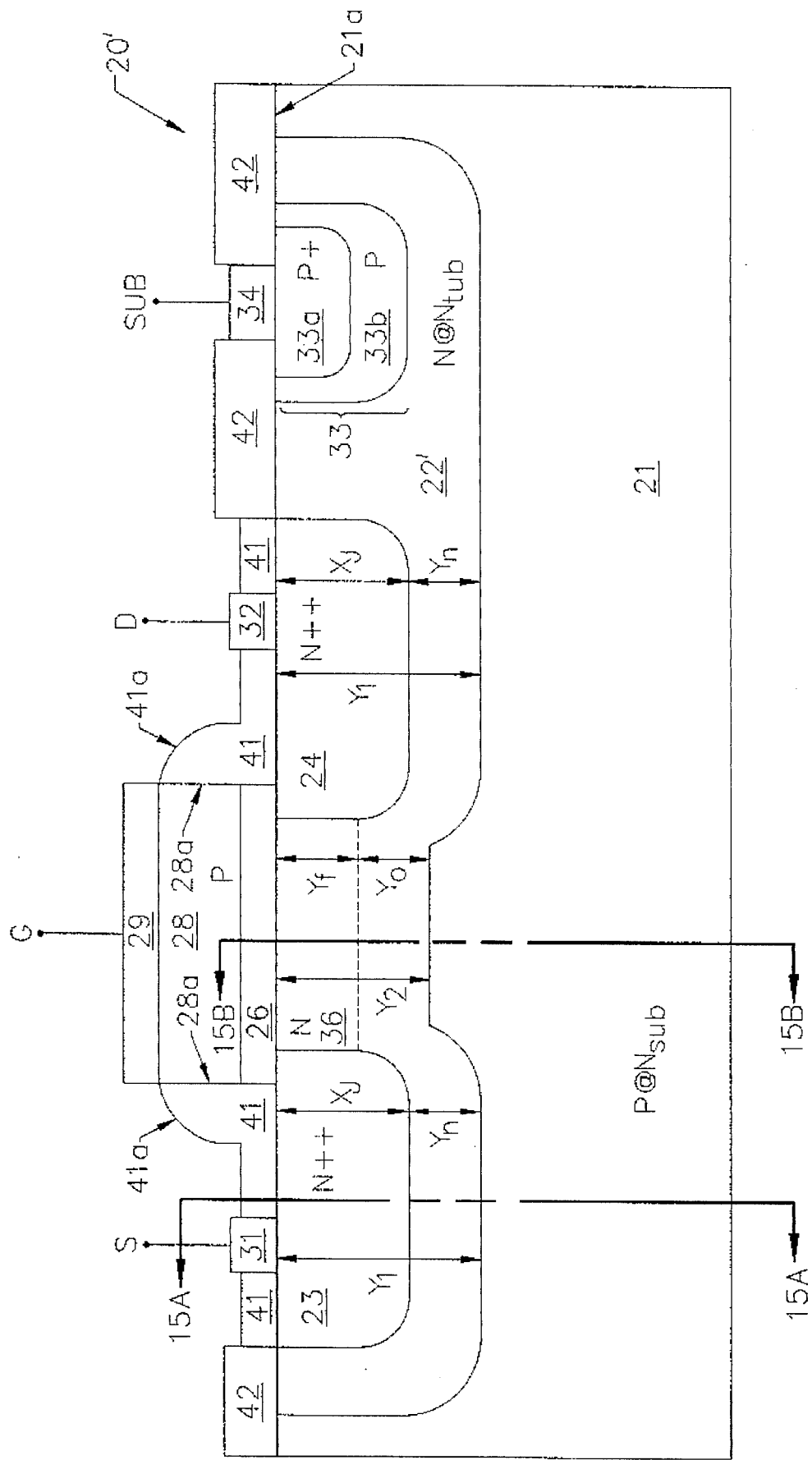
FIG. 14 illustrates a cross-sectional view of an N-channel contoured-tub Fermi-FET according to the present invention.

Referring now to FIG. 14, an N-channel contoured-tub Fermi-FET according to the present invention is illustrated. It will be understood by those having skill in the art that a P-channel Fermi-FET may be obtained by reversing the conductivities of the N and P regions. As illustrated in FIG. 14, contoured-tub Fermi-FET 20' is similar to high current Fermi-FET 20 of FIG. 1, except that a contoured-tub 22' is present rather than the tub 22 of FIG. 1 which has a uniform tub depth. Injector tubs and injector regions are not shown, although they may be present.

Still referring to FIG. 14, contoured-tub 22' has a first predetermined depth $Y_1$ from the substrate face 21a to below at least one of the spaced-apart source and drain regions 23, 24 respectively. The contoured-tub 22' has a second predetermined depth $Y_2$ from the substrate face 21a to below the channel region 36. According to the invention, $Y_2$ is different from, and preferably less than, $Y_1$ so as to create a contoured-tub 22'. Stated another way, the junction between tub 22' and substrate 21 is pushed downward, away from source and drain regions 23 and 24, relative to the position dictated by the tub-FET criteria under the channel, to reduce the source/drain diffusion capacitance and thereby allow the contoured-tub Fermi-FET to operate at low voltages. It will be understood by those having skill in the art that tub 22' may only be contoured under source region 23 or drain region 24 to produce an asymmetric device. However, symmetric devices in which the tub is contoured under source 23 and drain 24 are preferably formed.

The second predetermined depth $Y_2$ is selected based on the low capacitance Fermi-FET (tub-FET) criteria of application Ser. Nos. 07/826,939 and 07/977,689. These criteria, which determine the depths $Y_F$ and $Y_0$, and which together form the second predetermined depth $Y_2$, are described above.

The first predetermined depth ($Y_1$) is selected to be greater than the second predetermined depth $Y_2$. Preferably, the first predetermined depth is also selected to deplete the tub region 22' between the first predetermined depth $Y_1$ and the source and/or drain regions when zero voltage is applied to the source contact 31 and drain contact 32 respectively. Thus, the entire region labelled $Y_n$ is preferably totally depleted under zero source bias or drain bias respectively. Based on this criteria, $Y_1$ is determined by:

$$Y_n = \sqrt{\frac{kT}{q} \text{Ln}\left(\frac{N_{sub}N_{tub}}{n_i^2}\right) \frac{2\epsilon_s}{qN_{sub}} \frac{1}{\left(1+\frac{N_{sub}}{N_{tub}}\right)}} \quad (33)$$

where $N_{sub}$ is the doping concentration of the substrate 21 and $N_{tub}$ is the doping concentration of the contoured-tub 22'. This equation will be derived below.

Figure 15A:
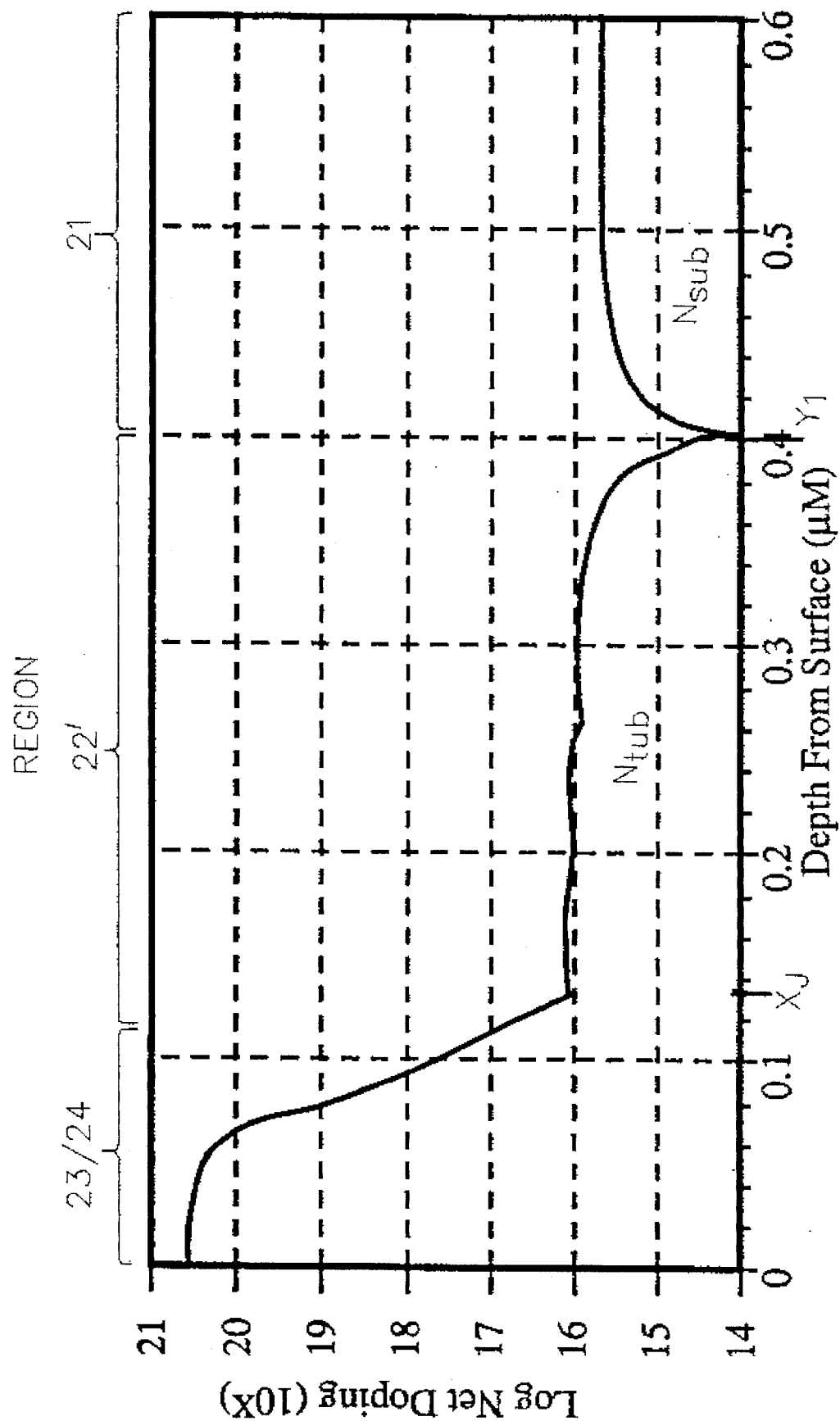
FIGS. 15A and 15B graphically illustrate example doping profiles and geometries for the contoured-tub Fermi-FET of FIG. 14.
Figure 15B:
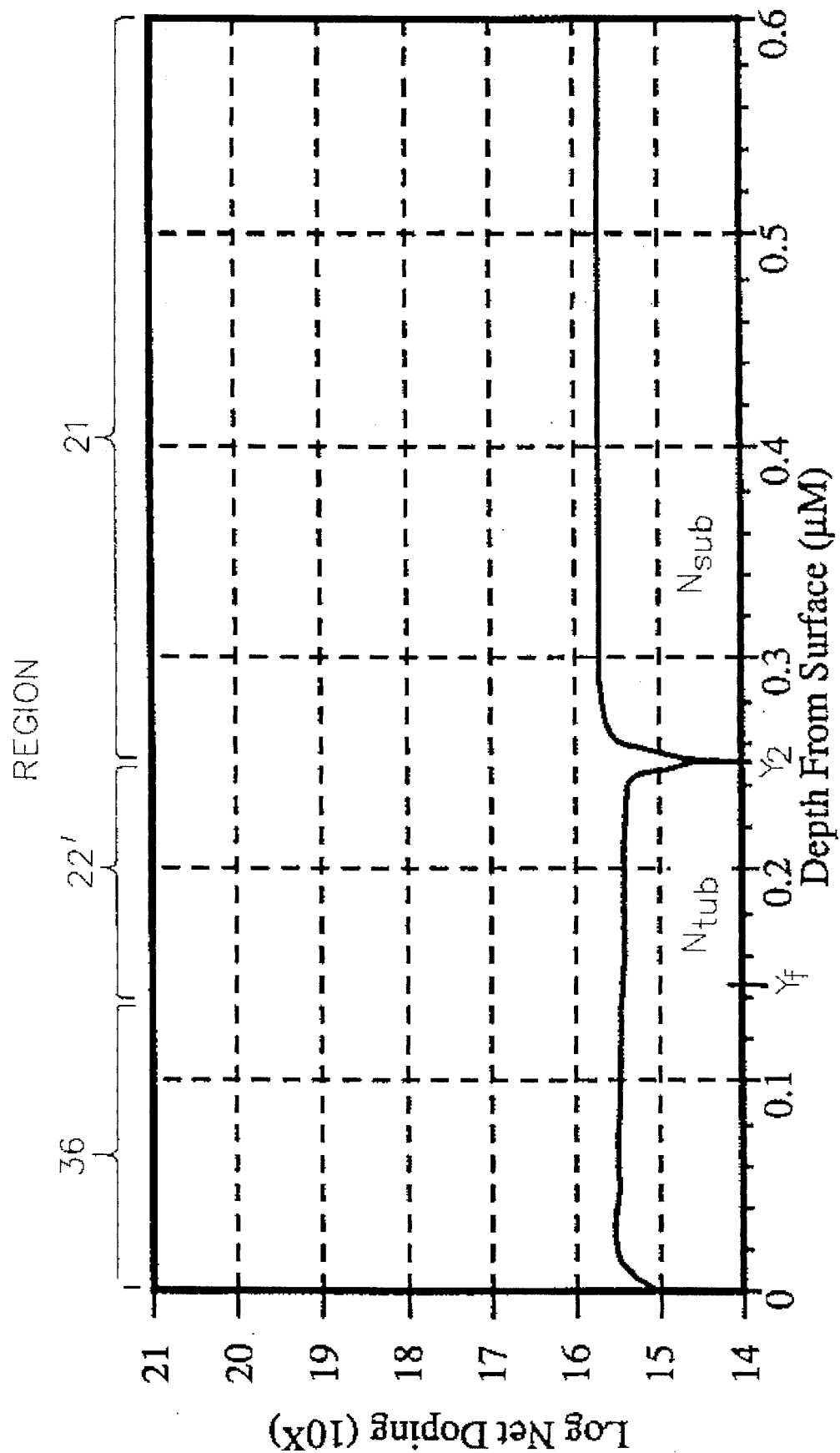

Referring now to FIGS. 15A and 15B, example doping profiles and geometries for the contoured-tub Fermi-FET of FIG. 14 are shown. FIG. 15A illustrates a doping profile along line 15A of FIG. 14. As shown, the depth of source and drain regions 23 and 24, labelled $X_j$, is about 0.14 μm and the doping concentration decreases from about $5\times10^{20}/\text{cm}^3$ to about $1\times10^{16}/\text{cm}^3$. The contoured-tub depth $Y_n$ (equal to $Y_1-X_j$) extends to about 0.4 μm at a doping concentration of $1\times10^{16}/\text{cm}^3$. The substrate doping 21 is about $8\times10^{15}/\text{cm}^3$.

Referring now to FIG. 15B, an example doping profile through line 15B of FIG. 14 is illustrated. As shown, the second predetermined depth $Y_2$ extends to about 0.25 μm at doping concentration of about $5\times10^{15}/\text{cm}^3$. The substrate doping concentration is about $8\times10^{15}/\text{cm}^3$. Accordingly, the difference between the first and second predetermined depth is about 0.15 μm.

Operation of Contoured-Tub Fermi-FET

The time delay required to pass through an arbitrary logic circuit can be represented by the following Equation:

$$T_d = \frac{V_d(1+\eta)}{I_{sat}*}\left[F_oL_oC_g* + F_iL_dC_d* + \frac{F_oC_w}{Z(1+\eta)}\right] \quad (34)$$

where $T_d$ is the total time delay, $F_o$ is the fan-out, $F_i$ is the fan-in and $L_d$ is the width of the diffusion normal to the gate electrode. The Fermi-FET design focused initially on the $I_{sat}*$ term (square channel saturation current) of Equation (34). For most reasonable values of power supply voltage $V_d$, the Fermi-FET is able to produce superior circuit speed due to the very high saturation currents produced.

FET devices typically scale down the transistor channel length with decreasing drain voltage to improve the $V_d/I_{sat}$ ratio with tends to drive the overall circuit speed. Recent emphasis in very low power portable and/or battery powered devices has driven the drain voltage lower while the need for low cost production has held the channel length relatively stable. At a fixed channel length, lowering the drain voltage causes the lateral electric field to decrease in a linear fashion. At very low drain voltages, the lateral electric field is low enough such that the carriers in the channel are prevented from reaching saturation velocity. This results in a precipitous drop in available drain current, effectively placing a minimum operating voltage for obtaining usable circuit speeds for a given channel length, $L_o$.

The three terms in brackets in Equation (34) are governed by the capacitances of the gate ($C_g*$), source/drain diffusions ($C_d*$), and metal wiring ($C_w$) respectively. If the available drive current produced by a device cannot be raised to acceptable levels, then reducing these terms would produce shorter delays.

Reduction of the third term (wiring capacitance $C_w$) is well understood. This term can be substantially reduced by either increasing the interlevel dielectric thickness (or utilizing a material with a lower relative permittivity) or by increasing the transistor width Z used to construct the circuit. The first term $C_g*$ is a function of gate capacitance which becomes particularly low in a tub-FET device operating at very low voltages since the initial carrier flow is near the bottom of the Fermi-channel region.

The second term of the delay equation is reduced according the present invention. The second term, $C_d*$, is the capacitance per unit area associated with the diffused source and drain regions of the transistor. For many low-power circuits, this term represents the largest component of the three terms in the brackets of Equation (34). The diffusion capacitance associated with a conventional MOSFET, which forms a junction between the source/drain and the substrate, can be represented utilizing the one-sided step junction approximation:

$$C_d* = \sqrt{\frac{q\epsilon_sN_{sub}}{2(V_{bi} \pm V_d)}} \quad (35)$$

where $$V_{bi} = \frac{kT}{q} \text{Ln}\left(\frac{N_dN_{sub}}{n_i^2}\right) \quad (36)$$

and $V_d$ is negative for the normal reverse bias condition. The Tub-FET has an inherent drain capacitance advantage over conventional MOSFET devices, at least partially due to the tub depth being larger than the diffusion depth. The lower relative doping of the Fermi-Tub surrounding the diffused regions modifies the capacitance equation to:

$$C_d* = \frac{\epsilon_s}{(Y_{tub} - X_j) + W_{sub}} \quad (37)$$

$W_{sub}$ is the width of the depletion region on the substrate side of the Tub-Substrate junction i.e. the junction formed by regions 22' and 21. Assuming an abrupt profile, $W_{sub}$ can be expressed as:

$$W_{sub} = \sqrt{\frac{2\epsilon_s V_{bi}}{qN_{sub}}} \quad (38)$$

Optimization of Fermi-FET transistor performance places limits on the Fermi-Tub depth, $Y_{tub}$ and substrate doping, among other reasons, in order to control subthreshold leakage and minimize process sensitivities. This limits the drain capacitance to a level that is low compared to standard MOS, but which may still be too large for very low voltage operation.

To address this problem, a contoured-tub is provided, such that the tub-substrate junction is moved significantly away from the diffusion edge. Preferably, the doping profile in the region below the drain and above the junction is adjusted such that the entire region is depleted under zero applied bias. Diffusion capacitance is then reduced proportional to the magnitude $(Y_1-X_j)$ where $Y_1$ is the tub depth below the substrate surface in the region below the diffusion. This depth can be increased up to the point where the depletion width on the Fermi-tub side of the junction just reaches the diffusion. At this point, the total depleted width $W_d$ behaves according to:

$$W_d = \sqrt{\frac{2\epsilon_s}{q}\left[\left(\frac{N_{sub}+N_{tub}}{N_{sub}N_{tub}}\right)V_{bi} + \left(\frac{V_d}{N_{sub}}\right)\right]} \quad (39)$$

Using the depletion approximation, the total depletion layer width due to a PN junction can be described as:

$$W_d = \sqrt{\frac{2\epsilon_s}{q}\left[\left(\frac{N_d+N_a}{N_dN_a}\right)V_{bi}\right]} \quad (40)$$

The total depletion width $W_d$ consists of two parts: a depletion width on the N-type side of the junction $Y_n$, and depletion width on the P-type side of the junction $Y_p$. Assuming an abrupt junction and flat doping profiles, the relative width of the two regions are proportional to the doping density on each side of the junction such that the amount of charge in each region is identical:

$$Y_nN_d = Y_pN_a \quad (41)$$

For low power applications, it is desirable that the depletion region on the Fermi-tub side of the junction ($Y_n$ for an N-Channel Fermi-FET) just reach the source/drain diffusion edge with zero volts bias on the diffusion. Assuming:

$$V_{bi} = \frac{1}{2}E_m(Y_N+Y_P) = \frac{kT}{q}\text{Ln}\left(\frac{N_dN_a}{n_i^2}\right) \quad (42)$$

and $$E_m = qN_dY_n/\epsilon_s = qN_aY_p/\epsilon_s \quad (43)$$

an equation for $Y_n$ can be written as:

$$Y_n = \sqrt{\frac{kT}{q}\text{Ln}\left(\frac{N_dN_a}{n_i^2}\right)\frac{2\epsilon_s}{qN_d}\frac{1}{\left(1+\frac{N_d}{N_a}\right)}} \quad (44)$$

Substituting $N_{sub}$ for $N_d$ and $N_{tub}$ for $N_a$, the depth $Y_n$ is:

$$Y_n = \sqrt{\frac{kT}{q}\text{Ln}\left(\frac{N_{sub}N_{tub}}{n_i^2}\right)\frac{2\epsilon_s}{qN_{sub}}\frac{1}{\left(1+\frac{N_{sub}}{N_{tub}}\right)}} \quad (45)$$

Optimum performance for capacitance and transistor leakage is provided when the length $Y_n$ is set equal to the overlap of the Fermi-tub below the diffused source and drain regions as shown in FIG. 14. The magnitude of the capacitance reduction will depend on the length $Y_n$, with $N_{sub}$ and $N_{tub}$ adjusted such that the zero bias $Y_n$ is given by Equation (45).

Figure 16:
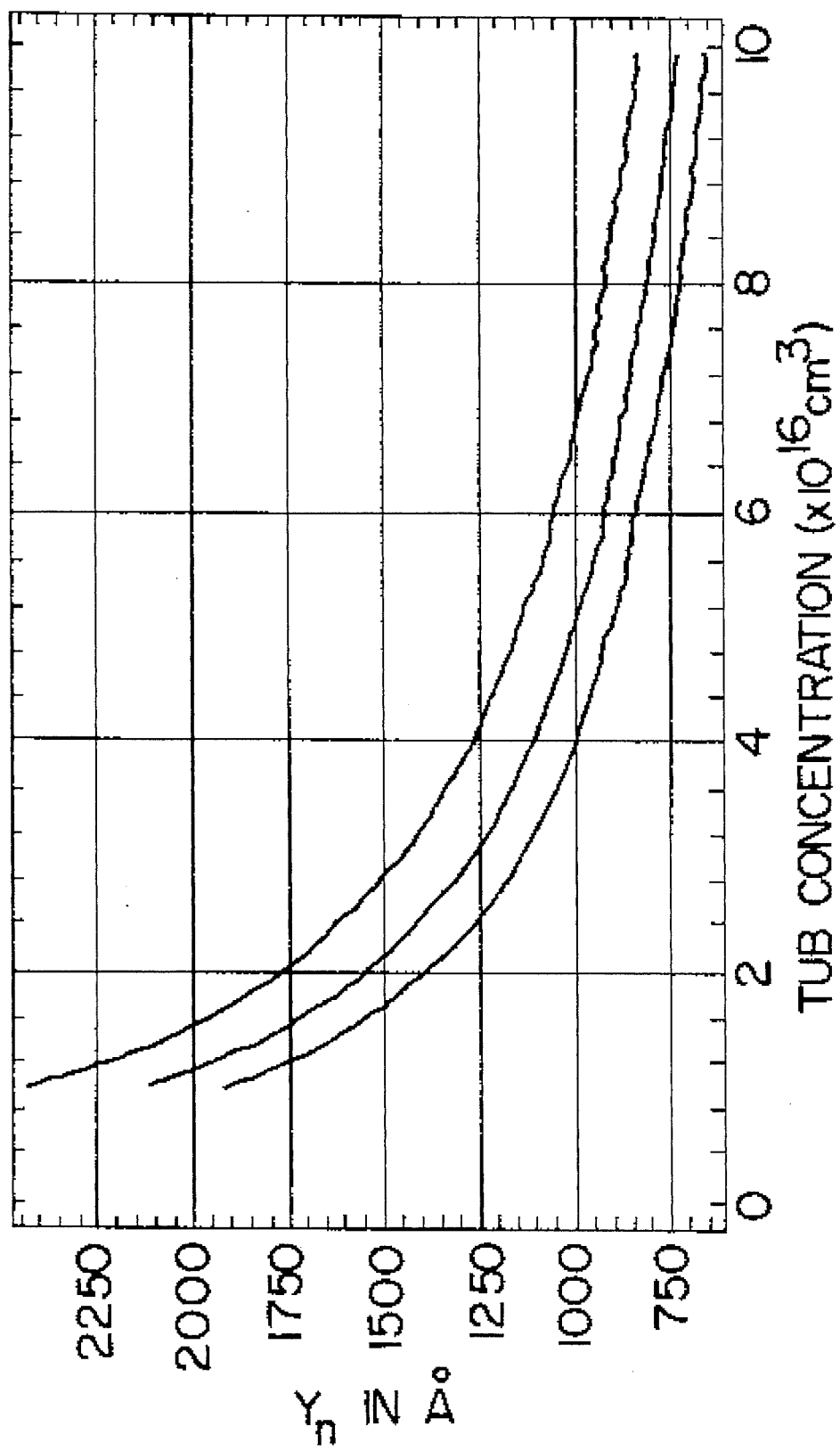
FIG. 16 graphically illustrates contoured-tub depth as a function of doping concentration for a contoured-tub Fermi-FET according to the present invention.

FIG. 16 depicts the length $Y_n$ versus the concentration of the tub under the diffusion, and the ratio of this tub concentration to the substrate concentration. The upper line is $N_{tub}/N_{sub}=0.5$. The middle and lower lines are for $N_{tub}/N_{sub}=1.0$ and $_{1.5}$ respectively.

Figure 17:
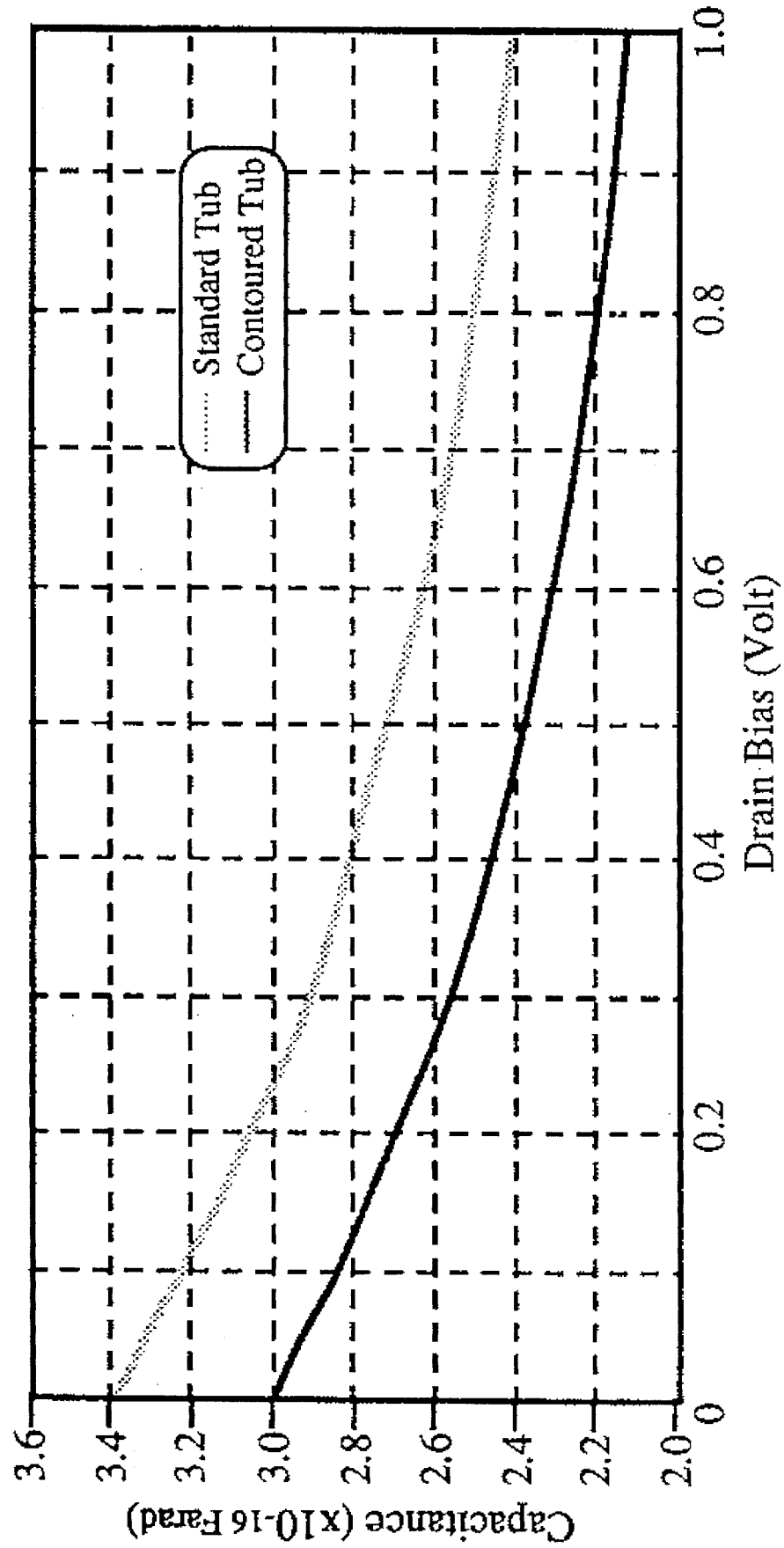
FIG. 17 graphically illustrates capacitance as a function of drain bias for a standard-tub Fermi-FET and a contoured-tub Fermi-FET according to the present invention.

PISCES2, a two dimensional device simulator, was used to model the diffusion capacitance of a conventional Tub-FET and a contoured-tub Fermi-FET. The diffusion capacitance for drain regions with identical layout area measured with $V_d$ ramped between 0 and 1 Volt is graphically illustrated in FIG. 17. As shown, the contoured-tub reduces the drain diffusion capacitance by over 12%, resulting in a significant improvement in predicted circuit performance. Further optimization of the tub contour can produce even greater improvements depending upon the specific architecture and doping profiles utilized. A corresponding improvement in Fermi-FET transistors designed for higher voltage and power applications is also produced.

Fabrication of Contoured-Tub Fermi-FET

A representative process for fabricating a contoured-tub Fermi-FET will now be described. In general, the first predetermined depth section may be formed by an additional implantation step during the source and drain implant process, at an energy such that the tub-substrate junction is moved significantly away from the diffusion edge. These implants may also be referred to as "shadow implants".

Figure 18A:
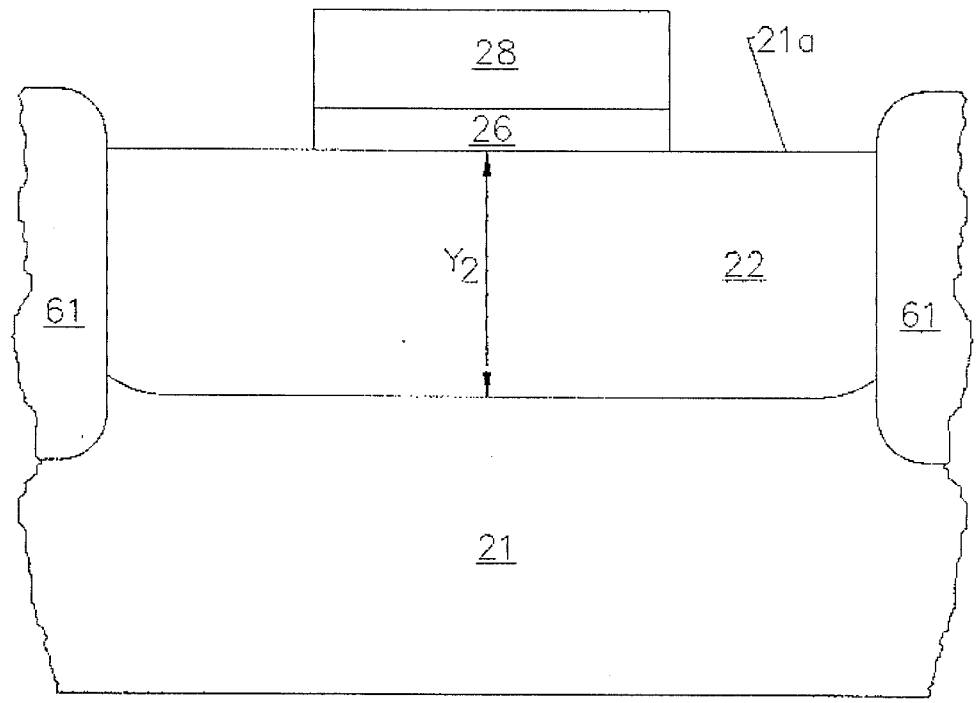
FIGS. 18A–18C illustrate cross-sectional views of the contoured-tub Fermi-FET of FIG. 14 during intermediate fabrication steps.

In particular, referring to FIG. 18A, a uniform depth tub 22 of first conductivity type is formed in semiconductor substrate 21 of second conductivity type. Tub 22 extends from face 21a of substrate 21 to a predetermined depth $Y_2$ from the substrate face 21a. Tub 22 is typically formed by implanting ions of the first conductivity type into the substrate at face 21a using field oxide 61 as a mask. After formation of tub 22, gate insulating layer 26 and gate electrode layer 28 are formed using conventional techniques.

Figure 18B:
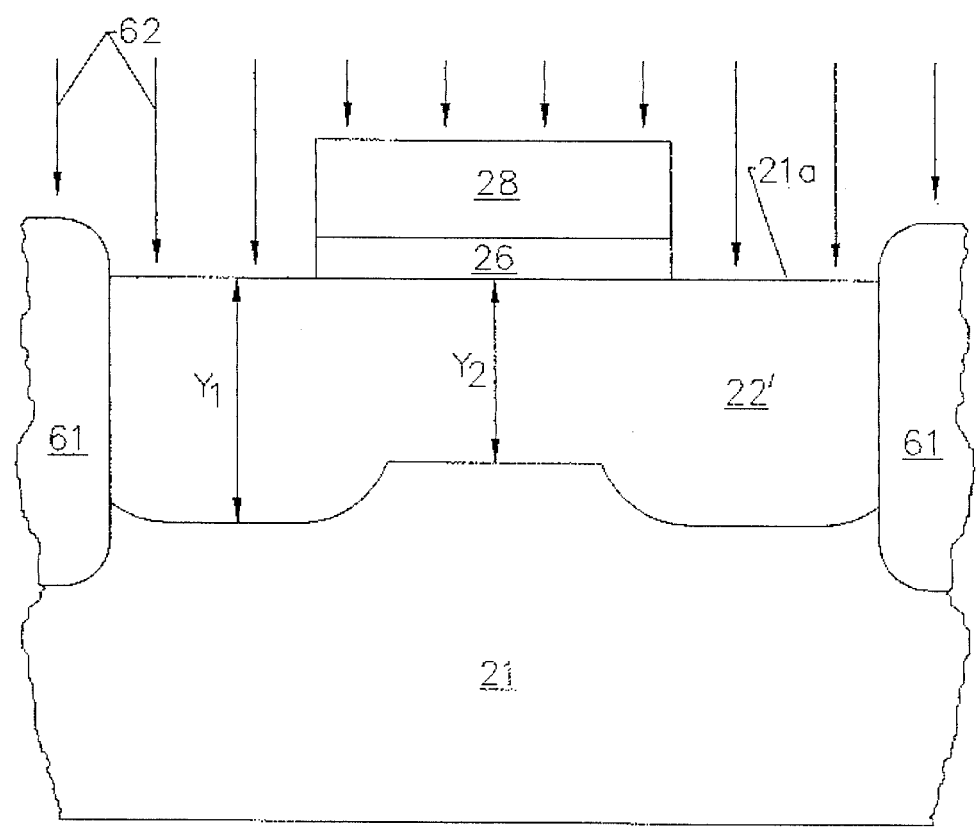

Referring now to FIG. 18B, first ions 62 of the first conductivity type are implanted into the substrate face 21a to a depth $Y_1$ which is greater than the depth $Y_2$. Gate 28 masks implantation of the first ions 62 into the substrate under the gate. Accordingly, the tub 22 and the first ions 62 form a contoured-tub 22' having nonuniform tub depth. Typically, first ions 62 are implanted at a low dose but relatively higher energy than the implant which formed tub 22.

Figure 18C:
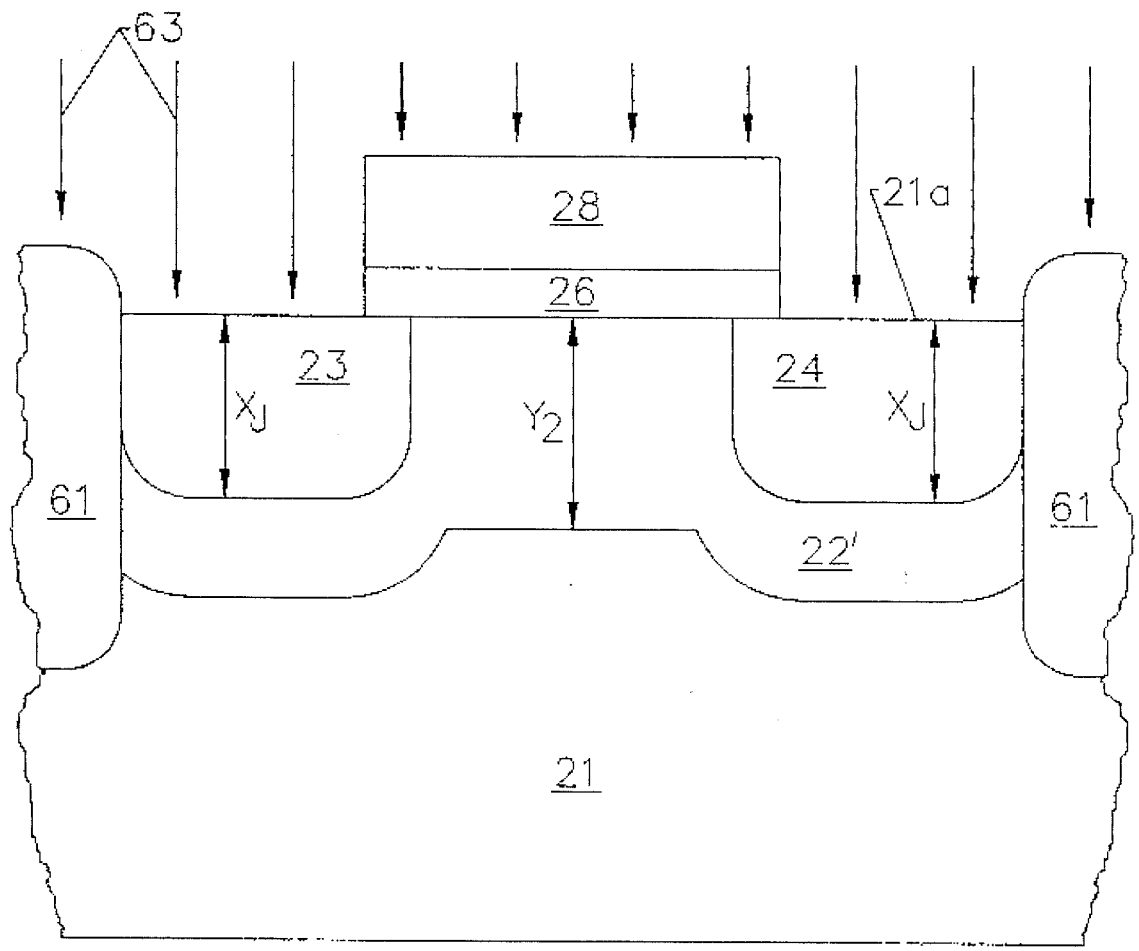

Referring now to FIG. 18C, second ions 63 of the first conductivity type are implanted into the substrate face 21a. Again, gate 28 masks implantation of the second ions into the substrate under the gate. Source and drain regions 23 are thereby formed at a depth $X_j$ from substrate face 21a. This implantation of second ions 63 is typically performed at a low dosage and a lower energy than the implant which formed tub 22. Conventional processing is then used to complete the transistor and form contacts to the transistor.

It will understood by those having skill in the art that the step of implanting second ions (FIG. 18C) may be performed prior to the step of implanting first ions 62 (FIG. 18B). It will also be understood that ions 62 and 63 may use the same ionic species, such as boron or phosphorus. However, different ionic species of the same conductivity type may also be used.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed:

1. A field effect transistor comprising:
a semiconductor substrate of first conductivity type;
spaced apart source and drain regions of second conductivity type in said semiconductor substrate at a face thereof;
a channel region of said second conductivity type in said semiconductor substrate at said substrate face, between said spaced apart source and drain regions;
a tub region of said second conductivity type in said semiconductor substrate at said substrate face, said tub region extending a first predetermined depth from said substrate face to below at least one of said spaced apart source and drain regions and extending a second predetermined depth from said substrate face to below said channel region, wherein said second predetermined depth is less than said first predetermined depth;
a gate insulating layer on said substrate face between said spaced apart source and drain regions; and
source, drain and gate contacts for contacting said source and drain regions and said gate insulating layer respectively.

2. A field effect transistor according to claim 1 wherein said channel region extends a third predetermined depth from said substrate face, said second predetermined depth being selected to produce zero static electric field perpendicular to said substrate face at said third predetermined depth.

3. A field effect transistor according to claim 1 wherein said second predetermined depth is selected to produce a threshold voltage for said field effect transistor which is twice the Fermi potential of said semiconductor substrate.

4. A field effect transistor according to claim 1 wherein said channel region extends a third predetermined depth from said substrate face, said second predetermined depth being selected to allow carriers of said second conductivity type to flow from said source region to said drain region in said channel region, extending from said third predetermined depth towards said substrate face upon application of voltage to said gate contact beyond the threshold voltage of said field effect transistor.

5. A field effect transistor according to claim 1 wherein said channel region extends a third predetermined depth from said substrate face, at least one of said second and third predetermined depths being selected to allow carriers of said second conductivity type to flow within said channel region, from said source region to said drain region and beneath said substrate face, without creating an inversion layer in said channel region.

6. A field effect transistor according to claim 1 wherein said first predetermined depth is selected to deplete said tub region, between said first predetermined depth and said source region, upon application of zero bias to said source contact.

7. A field effect transistor according to claim 1 wherein said first predetermined depth is selected to deplete said tub region, between said first predetermined depth and said drain region, upon application of zero bias to said drain contact.

8. A field effect transistor according to claim 1 wherein said substrate is doped said first conductivity type at a uniform doping concentration adjacent said tub region.

9. A field effect transistor according to claim 1 wherein said substrate is doped at a doping concentration $N_{sub}$, has an intrinsic carrier concentration $n_i$ at temperature T degrees Kelvin and a Permittivity $\epsilon_s$; wherein said tub region is doped at a doping concentration $N_{tub}$; wherein said source extends a fourth predetermined depth $X_j$ from said substrate face; and wherein said first predetermined depth is equal to:

$$X_j + \sqrt{\frac{kT}{q} \operatorname{Ln}\left(\frac{N_{sub}N_{tub}}{n_i^2}\right) \frac{2\epsilon_s}{qN_{sub}} \frac{1}{\left(1+\frac{N_{sub}}{N_{tub}}\right)}}$$

where q is $1.6 \times 10^{-19}$ coulombs and k is $1.38 \times 10^{-23}$ Joules/°Kelvin.

10. A field effect transistor comprising:
a semiconductor substrate of first conductivity type;
spaced apart source and drain regions of second conductivity type in said semiconductor substrate at a face thereof;
a channel region of said second conductivity type in said semiconductor substrate at said substrate face, between said spaced apart source and drain regions;
a tub region of said second conductivity type in said semiconductor substrate at said substrate face, surrounding said spaced apart source and drain regions and said channel region, wherein said tub region has nonuniform tub depth below said spaced apart source and drain regions relative to below said channel region;
a gate insulating layer on said substrate face between said spaced apart source and drain regions; and
source, drain and gate contacts for contacting said source and drain regions and said gate insulating layer respectively.

11. A field effect transistor comprising:
a semiconductor substrate of first conductivity type;
spaced apart source and drain regions of second conductivity type in said semiconductor substrate at a face thereof;
a channel region of said second conductivity type in said semiconductor substrate at said substrate face, between said spaced apart source and drain regions;
a tub reckon of said second conductivity type in said semiconductor substrate at said substrate face, surrounding said spaced apart source and drain regions and said channel region, wherein said tub region has nonuniform tub depth;
a gate insulating layer on said substrate face between said spaced apart source and drain regions; and
source, drain and gate contacts for contacting said source and drain regions and said gate insulating layer respectively;
wherein said channel region extends a predetermined depth from said substrate face, said nonuniform tub depth being selected to produce zero static electric field perpendicular to said substrate face at said predetermined depth.

12. A field effect transistor comprising:
a semiconductor substrate of first conductivity type;
spaced apart source and drain regions of second conductivity type in said semiconductor substrate at a face thereof;
a channel region of said second conductivity type in said semiconductor substrate at said substrate face, between said spaced apart source and drain regions;
a tub region of said second conductivity type in said semiconductor substrate at said substrate face, surrounding said spaced apart source and drain regions and said channel region, wherein said tub region has nonuniform tub depth;
a gate insulating layer on said substrate face between said spaced apart source and drain regions; and source, drain and gate contacts for contacting said source and drain regions and said gate insulating layer respectively;

wherein said nonuniform tub depth is selected to produce a threshold voltage for said field effect transistor which is twice the Fermi potential of said semiconductor substrate.

13. A field effect transistor comprising:

a semiconductor substrate of first conductivity type;

spaced apart source and drain regions of second conductivity type in said semiconductor substrate at a face thereof;

a channel region of said second conductivity type in said semiconductor substrate at said substrate face, between said spaced apart source and drain regions;

a tub region of said second conductivity type in said semiconductor substrate at said substrate face, surrounding said spaced apart source and drain regions and said channel region, wherein said tub region has nonuniform tub depth;

a gate insulating layer on said substrate face between said spaced apart source and drain regions; and source, drain and gate contacts for contacting said source and drain regions and said gate insulating layer respectively;

wherein said channel region extends a predetermined depth from said substrate face, said nonuniform tub depth being selected to allow carriers of said second conductivity type to flow from said source region to said drain region in said channel region, extending from said predetermined depth towards said substrate face upon application of voltage to said gate contact beyond the threshold voltage of said field effect transistor.

14. A field effect transistor according to claim 10 wherein said channel region extends a predetermined depth from said substrate face, at least one of said predetermined depth and said nonuniform tub depth being selected to allow carriers of said second conductivity type to flow within said channel region, from said source region to said drain region and beneath said substrate face, without creating an inversion layer in said channel region.

15. A field effect transistor comprising:

a semiconductor substrate of first conductivity type;

spaced apart source and drain regions of second conductivity type in said semiconductor substrate at a face thereof;

a channel region of said second conductivity type in said semiconductor substrate at said substrate face, between said spaced apart source and drain regions;

a tub region of said second conductivity type in said semiconductor substrate at said substrate face, surrounding said spaced apart source and drain regions and said channel region, wherein said tub region has nonuniform tub depth;

a gate insulating layer on said substrate face between said spaced apart source and drain regions; and source, drain and gate contacts for contacting said source and drain regions and said gate insulating layer respectively;

wherein said nonuniform tub depth is selected to deplete said tub region, under said source region, upon application of zero bias to said source contact.

16. A field effect transistor comprising:

a semiconductor substrate of first conductivity type;

spaced apart source and drain regions of second conductivity type in said semiconductor substrate at a face thereof;

a channel region of said second conductivity type in said semiconductor substrate at said substrate face, between said spaced apart source and drain regions;

a tub region of said second conductivity type in said semiconductor substrate at said substrate face, surrounding said spaced apart source and drain regions and said channel region, wherein said tub region has nonuniform tub depth;

a gate insulating layer on said substrate face between said spaced apart source and drain regions; and source, drain and gate contacts for contacting said source and drain regions and said gate insulating layer respectively;

wherein said nonuniform tub depth is selected to deplete said tub region, under said drain region, upon application of zero bias to said drain contact.

17. A field effect transistor according to claim 10 wherein said substrate is doped said first conductivity type at a uniform doping concentration adjacent said tub region.

18. A field effect transistor comprising:

a semiconductor substrate of first conductivity type at a doping concentration $N_{sub}$, having intrinsic carrier concentration $N_i$ at temperature T degrees Kelvin and a Permittivity $\epsilon_s$;

spaced apart source and drain regions of second conductivity type in said semiconductor substrate at a face thereof extending a depth $X_j$ from said substrate face;

a channel region of said second conductivity type in said semiconductor substrate at said substrate face, between said spaced apart source and drain regions;

a tub region of said second conductivity type in said semiconductor substrate at said substrate face and being doped at a doping concentration $N_{tub}$, said tub region extending a first predetermined depth from said substrate face to below said spaced apart source and drain regions, wherein said first predetermined depth is equal to:

$$X_j + \sqrt{\frac{kT}{q} \text{Ln}\left(\frac{N_{sub}N_{tub}}{n_i^2}\right) \frac{2\epsilon_s}{qN_{sub}} \frac{1}{\left(1 + \frac{N_{sub}}{N_{tub}}\right)}}$$

where q is $1.6 \times 10^{-19}$ coulombs and k is $1.38 \times 10^{-23}$ Joules/°Kelvin;

a gate insulating layer on said substrate face between said spaced apart source and drain regions; and source, drain and gate contacts for contacting said source and drain regions and said gate insulating layer respectively.

19. A field effect transistor according to claim 18 wherein said tub region extends a second predetermined depth from said substrate face to below said channel region, and wherein said channel region extends a third predetermined depth from said substrate face, said second predetermined depth being selected to produce zero static electric field perpendicular to said substrate face at said third predetermined depth.

20. A field effect transistor according to claim 18 wherein said tub region extends a second predetermined depth from said substrate face to below said channel region, and wherein said second predetermined depth is selected to produce a threshold voltage for said field effect transistor which is twice the Fermi potential of said semiconductor substrate.

21. A field effect transistor according to claim 18 wherein said tub region extends a second predetermined depth from said substrate face to below said channel region, and wherein said channel region extends a third predetermined depth from said substrate face, said second predetermined depth being selected to allow carriers of said second conductivity type to flow from said source region to said drain region in said channel region, extending from said third predetermined depth towards said substrate face upon application of voltage to said gate contact beyond the threshold voltage of said field effect transistor.

22. A field effect transistor according to claim 18 wherein said tub region extends a second predetermined depth from said substrate face to below said channel region, and wherein said channel region extends a third predetermined depth from said substrate face, at least one of said second and third predetermined depths being selected to allow carriers of said second conductivity type to flow within said channel region, from said source region to said drain region and beneath said substrate face, without creating an inversion layer in said channel region.

23. A field effect transistor according to claim 18 wherein said substrate is doped said first conductivity type at a uniform doping concentration adjacent said tub region.

* * * * *